US00RE47989E

(19) United States
(12) Reissued Patent
Yokoyama et al.

(10) Patent Number: US RE47,989 E
(45) Date of Reissued Patent: May 12, 2020

(54) ACOUSTIC WAVE DEVICE

(71) Applicant: TAIYO YUDEN CO., LTD., Chuo-ku, Tokyo (JP)

(72) Inventors: Tsuyoshi Yokoyama, Takasaki (JP); Yoshiki Iwazaki, Takasaki (JP); Tokihiro Nishihara, Takasaki (JP); Yosuke Onda, Takasaki (JP)

(73) Assignee: TAIYO YUDEN CO., LTD., Tokyo (JP)

(21) Appl. No.: 15/655,800

(22) Filed: Jul. 20, 2017

Related U.S. Patent Documents

Reissue of:
(64) Patent No.: 9,087,979
Issued: Jul. 21, 2015
Appl. No.: 13/787,497
Filed: Mar. 6, 2013

(30) Foreign Application Priority Data

Mar. 15, 2012 (JP) ..... 2012-058441
Nov. 14, 2012 (JP) ..... 2012-250535

(51) Int. Cl.
*H01L 41/18* (2006.01)
*H01L 41/08* (2006.01)
(Continued)

(52) U.S. Cl.
CPC ..... *H01L 41/0805* (2013.01); *H03H 9/02015* (2013.01); *H03H 9/173* (2013.01);
(Continued)

(58) Field of Classification Search
CPC ..... H01L 41/18; H01L 41/08; H01L 41/0805; H01L 41/187; H01L 41/316; H01L 41/0815; H03H 9/54; H03H 9/02; H03H 9/17; H03H 9/58; H03H 9/02015; H03H 9/173; H03H 9/0222; H03H 9/02102; H03H 9/02228; H03H 9/174; H03H 9/175; H03H 9/584; C23C 14/0641; C23C 14/3464
(Continued)

(56) References Cited

U.S. PATENT DOCUMENTS 4,456,850 A 6/1984 Inoue et al.
5,719,538 A * 2/1998 Kadota ..... H03H 9/02551 333/193
(Continued)

FOREIGN PATENT DOCUMENTS

JP 2002-344279 A 11/2002
JP 2009-010926 A 1/2009

OTHER PUBLICATIONS

Non-Final Office Action issued by U.S. Patent and Trademark Office, dated Dec. 24, 2014, for related U.S. Appl. No. 13/787,497.
Rajan S. Naik, and 10 others, "Measurements of the Bulk, C-Axis Electromechanical Coupling Constant as a Function of AlN Film Quality", IEEE Transactions on Ultrasonics, Ferroelectrics, and Frequency Control, 2000, vol. 47, p. 292-296.

*Primary Examiner* — My Trang Ton
(74) *Attorney, Agent, or Firm* — Law Office of Katsuhiro Arai

(57) ABSTRACT

An acoustic wave device includes: a piezoelectric film made of an aluminum nitride film containing a divalent element and a tetravalent element, or a divalent element and a pentavalent element; and an electrode that excites an acoustic wave propagating through the piezoelectric film.

41 Claims, 32 Drawing Sheets

(51) Int. Cl.

| | |
|---|---|
| ***H03H 9/54*** | (2006.01) |
| ***H03H 9/02*** | (2006.01) |
| ***H03H 9/17*** | (2006.01) |
| ***H03H 9/58*** | (2006.01) |
| ***H01L 41/187*** | (2006.01) |

(52) U.S. Cl.
CPC ..... *H03H 9/54* (2013.01); *H01L 41/187* (2013.01); *H03H 9/0222* (2013.01); *H03H 9/02102* (2013.01); *H03H 9/02228* (2013.01); *H03H 9/174* (2013.01); *H03H 9/175* (2013.01); *H03H 9/584* (2013.01)

(58) Field of Classification Search
USPC ..... 310/328, 330, 358, 312; 333/133, 187, 333/189, 195; 252/62.9 R
See application file for complete search history.

(56) References Cited

U.S. PATENT DOCUMENTS

| | | | | |
|---|---|---|---|---|
| 6,097,133 | A * | 8/2000 | Shimada et al. | 310/358 |
| 6,744,076 | B2 * | 6/2004 | Fukuyama | C30B 25/02 257/103 |
| 7,468,143 | B2 * | 12/2008 | Takeda | 252/62.9 R |
| 8,456,258 | B2 * | 6/2013 | Coudrain | H03H 3/04 310/324 |
| 2004/0135144 | A1 | 7/2004 | Yamada et al. | |
| 2008/0024042 | A1 * | 1/2008 | Isobe et al. | 310/365 |
| 2008/0296529 | A1 | 12/2008 | Akiyama et al. | |

* cited by examiner

ACOUSTIC WAVE DEVICE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*The present reissue application is a reissue application of U.S. application Ser. No. 13/787,497, filed Mar. 6, 2013, now U.S. Pat. No. 9,087,979.*

CROSS-REFERENCE TO RELATED APPLICATION

This application is based upon and claims the benefit of priority of the prior Japanese Patent Application Nos. 2012-058441 filed on Mar. 15, 2012 and 2012-250535 filed on Nov. 14, 2012, the entire contents of which are incorporated herein by reference.

FIELD

A certain aspect of the present invention relates to acoustic wave devices.

BACKGROUND

Diffusion of wireless communication devices including mobile phones has encouraged development of filters formed by combining acoustic wave devices using a surface acoustic wave (SAW) or bulk acoustic wave (BAW). The filter using a SAW or BAW has a small outer shape and a high Q compared to a dielectric filter, and thus is suitable for a high-frequency component in a wireless communication device such as a mobile phone required to be small in size and have a steep skirt characteristic. Moreover, there has been suggested an acoustic wave device using a Lamb wave as a developed device of the acoustic wave device using a SAW or BAW.

In recent years, filters are required to have high performance. For example, a bandwidth of a filter characteristic is required to be widened. The bandwidth of the filter characteristic can be widened by increasing an electromechanical coupling coefficient of an acoustic wave device used in the filter. Use of a piezoelectric film with a high electromechanical coupling coefficient can increase the electromechanical coupling coefficient of the acoustic wave device.

When an aluminum nitride film is used as the piezoelectric film, the electromechanical coupling coefficient of the acoustic wave device can be improved by controlling a c-axis orientation of the aluminum nitride film as disclosed in Rajan S. Naik, and 10 others, "Measurements of the Bulk, C-Axis Electromechanical Coupling Constant as a Function of AlN Film Quality", IEEE TRANSACTIONS ON ULTRASONICS, FERROELECTRICS AND FREQUENCY CONTROL, 2000, vol. 47, p. 292-296 (Non-Patent Document 1), for example. For example, the electromechanical coupling coefficient of the acoustic wave device can be improved by using an aluminum nitride film containing an alkali earth metal and/or a rare-earth metal for the piezoelectric film as disclosed in Japanese Patent Application Publication No. 2002-344279 (Patent Document 1). Moreover, piezoelectric response of the acoustic wave device can be improved by using an aluminum nitride film containing scandium at a content rate in a predetermined range for the piezoelectric film as disclosed in Japanese Patent Application Publication No. 2009-10926 (Patent Document 2).

However, the art disclosed in Non-Patent Document 1 aims to improve the electromechanical coupling coefficient of the aluminum nitride film, and thus fails to obtain an electromechanical coupling coefficient higher than that obtained from a material characteristic of the aluminum nitride film. In addition, the art disclosed in Patent Document 1 aims to improve the electromechanical coupling coefficient by increasing a bond concentration of a grain boundary between c-axis oriented aluminum nitride particles, and thus fails to obtain an electromechanical coupling coefficient higher than that obtained from a material characteristic of the aluminum nitride film.

The acoustic wave device grows in size and thus increases cost as a resonance frequency decreases.

SUMMARY OF THE INVENTION

According to an aspect of the present invention, there is provided an acoustic wave device including: a piezoelectric film made of an aluminum nitride film containing a divalent element and a tetravalent element, or a divalent element and a pentavalent element; and an electrode that excites an acoustic wave propagating through the piezoelectric film.

According to another aspect of the present invention, there is provided an acoustic wave device including: a piezoelectric film made of an aluminum nitride film containing an element that achieves at least one of an increase in a permittivity and a decrease in an acoustic velocity; and an electrode that excites an acoustic wave propagating through the piezoelectric film, wherein a resonance frequency is less than or equal to 1.5 GHz.

DETAILED DESCRIPTION

Hereinafter, a description will be given of embodiments of the present invention with reference to the attached drawings.

First Embodiment

Figure 1:
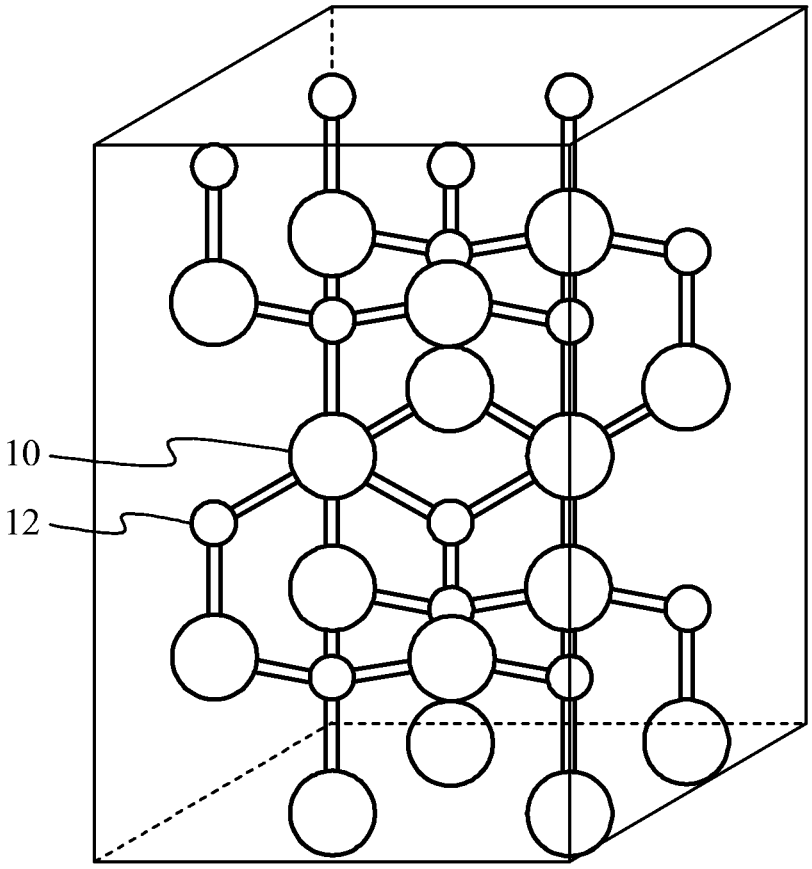
FIG. 1 illustrates a structure of aluminum nitride used for simulations.

A description will now be given of a simulation for aluminum nitride (AlN) conducted by the inventors. The simulation was conducted with a method called a first principle calculation. Methods of calculating an electronic state without using fitting parameters or the like are collectively referred to as the first principle calculation, which can calculate the electronic state by using only atomic numbers and coordinates of atoms constituting a unit lattice or molecule. FIG. 1 illustrates a structure of AlN used for the simulation. As illustrated in FIG. 1, used for the simulation is AlN with a wurtzite-type crystal structure that is a supercell containing sixteen aluminum atoms 10 and sixteen nitrogen atoms 12 obtained by doubling a unit lattice containing two aluminum atoms 10 and two nitrogen atoms 12 in a-axis, b-axis, and c-axis directions. The first principle calculation is performed to the AlN with the wurtzite-type crystal structure by moving an atomic coordinate, a cell volume, and a cell shape simultaneously, and the electronic state of the AlN in a stable structure is calculated.

Table 1 presents a lattice constant in the a-axis direction, a lattice constant in the c-axis direction, and a ratio (c/a) of the lattice constant in the c-axis direction to the lattice constant in the a-axis direction calculated from the electronic state of the AlN in the stable structure obtained by the first principle calculation. Table 1 also presents experimental values obtained by actually forming an AlN film by sputtering and measuring the AlN film by X-ray diffraction.

TABLE 1

| | Lattice constant in a-axis direction [Å] | Lattice constant in c-axis direction [Å] | c/a |
|---|---|---|---|
| Calculated value | 3.11 | 4.98 | 1.60 |
| Experimental value | 3.11 | 4.98 | 1.60 |

As presented in Table 1, both the calculation value and the experimental value are 3.11 [Å] with respect to the lattice constant in the a-axis direction, 4.98 [Å] with respect to the lattice constant in the c-axis direction, and 1.60 with respect to the c/a ratio. This result demonstrates that the above-described simulation using the first principle calculation is valid.

A description will now be given of a simulation for doped AlN doped with an element other than aluminum (Al) and nitrogen (N). Hereinafter, AlN that is not doped with an element other than Al and N is referred to as non-doped AlN. The simulation is performed to doped AlN with a crystal structure formed by substituting a divalent element in one of the aluminum atoms 10 and substituting a tetravalent element in another one of the aluminum atoms 10 in non-doped AlN with the wurtzite-type crystal structure described in FIG. 1. That is to say, the simulation is performed to the doped AlN with the wurtzite-type crystal structure containing fourteen aluminum atoms, one divalent element, one tetravalent element, and sixteen nitrogen atoms formed by substituting a divalent element and a tetravalent element in a part of aluminum sites. Here, referred to as a substitutional concentration is an atomic concentration of a substitution element when a total of the number of aluminum atoms and the number of atoms of the substitution element defines 100 atomic %. Thus, the divalent element and the tetravalent element contained in the doped AlN for the simulation have substitutional concentrations of 6.25 atomic %. Calcium (Ca), magnesium (Mg), strontium (Sr), or zinc (Zn) is used as the divalent element, and titanium (Ti), zirconium (Zr), or hafnium (Hf) is used as the tetravalent element.

As is the case with the non-doped AlN, the first principle calculation can calculate an electronic state of the doped AlN in the stable structure, and the calculated electronic state allows a lattice constant in the a-axis direction, a lattice constant in the c-axis direction, and a c/a ratio to be calculated. The first principle calculation can also calculate piezoelectric constants, elastic constants, and permittivities of the non-doped AlN and the doped AlN from minor change of total energy caused by a small strain forcibly applied to the crystal lattices of the non-doped AlN and the doped AlN in the stable structure. A relational expression (Expression 1) holds true among a piezoelectric constant $e_{33}$, an elastic constant $C_{33}$, and a permittivity $\in_{33}$ in the c-axis direction and an electromechanical coupling coefficient $k^2$ (hereinafter, referred to as $k^2$). Therefore, electromechanical coupling coefficients $k^2$ of the non-doped AlN and the doped AlN can be calculated by calculating piezoelectric constants $e_{33}$, elastic constants $C_{33}$, and permittivities $\in_{33}$ of the non-doped AlN and the doped AlN respectively.

$$k^2 = \frac{e_{33}^2}{\varepsilon_{33} \times C_{33}} \quad \text{[Expression 1]}$$

Table 2 presents calculated piezoelectric constants $e_{33}$ and $k^2$ calculated from Expression 1 of the non-doped AlN and the doped AlN. As presented in Table 2, the obtained results demonstrate that the doped AlN doped with a divalent element and a tetravalent element (Case 1 through Case 10) have piezoelectric constants $e_{33}$ and electromechanical coupling coefficients $k^2$ greater than those of the non-doped AlN (Non-doped AlN in Table 2). A combination of the divalent element and the tetravalent element may be Ca—Ti, Ca—Zr, Ca—Hf, Mg—Ti, Mg—Zr, Mg—Hf, Sr—Hf, Zn—Ti, Zn—Zr, or Zn—Hf as presented in Table 2, and may be other combinations.

TABLE 2

| Combination | Divalent element | Tetravalent element | Piezoelectric constant $e_{33}$ [C/m$^2$] | Electromechanical coupling coefficient $k^2$ [%] |
|---|---|---|---|---|
| Case 1 | Ca | Ti | 1.77 | 9.68 |
| Case 2 | Ca | Zr | 1.85 | 10.3 |
| Case 3 | Ca | Hf | 2.17 | 14.2 |
| Case 4 | Mg | Ti | 2.09 | 12.9 |
| Case 5 | Mg | Zr | 2.13 | 13.5 |
| Case 6 | Mg | Hf | 2.46 | 17.6 |
| Case 7 | Sr | Hf | 1.96 | 11.3 |
| Case 8 | Zn | Ti | 2.08 | 12.5 |
| Case 9 | Zn | Zr | 2.01 | 12.4 |
| Case 10 | Zn | Hf | 2.32 | 11.1 |
| Non-doped AlN | — | — | 1.55 | 7.12 |

As presented above, the inventors have newly found that doped AlN containing a divalent element and a tetravalent element has an electromechanical coupling coefficient $k^2$ greater than that of non-doped AlN. Thus, a description will now be given of a first embodiment capable of obtaining an acoustic wave device having a high electromechanical coupling coefficient $k^2$ based on the above knowledge.

Figure 2A:
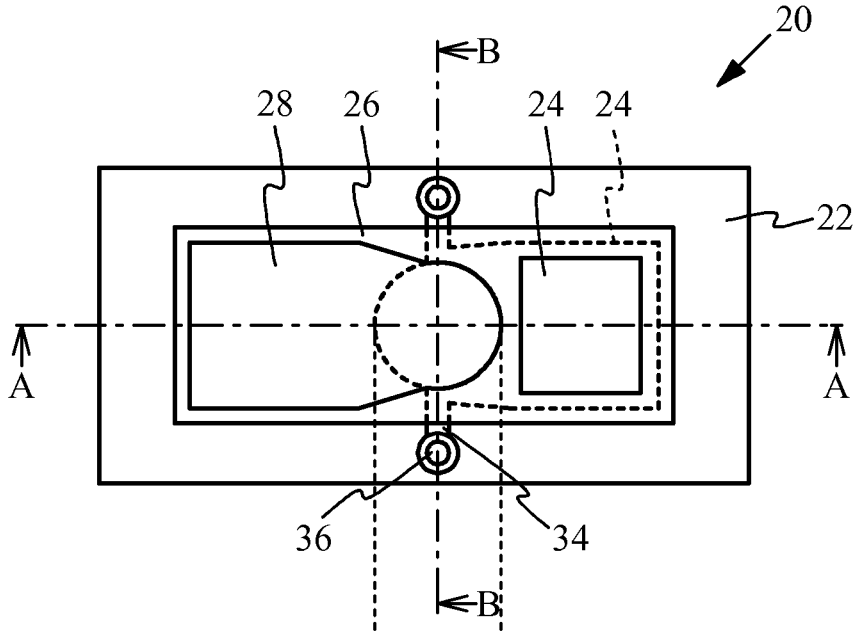
FIG. 2A is a top view of an acoustic wave device in accordance with a first embodiment.
Figure 2B:
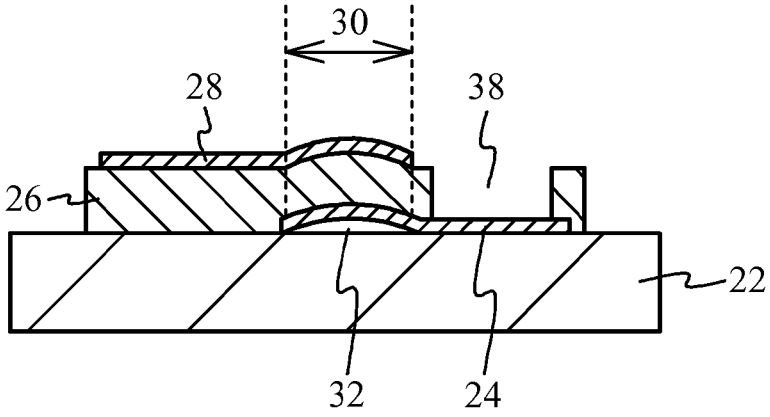
FIG. 2B is a cross-sectional view taken along line A-A in FIG. 2A.
Figure 2C:
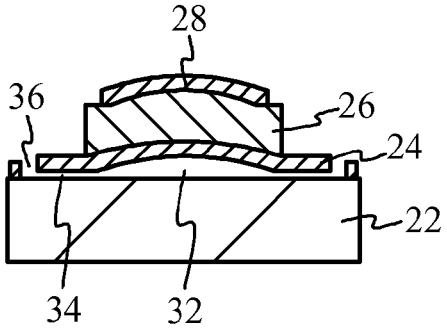
FIG. 2C is a cross-sectional view taken along line B-B in FIG. 2A, FIG. 3A through FIG. 3H are cross-sectional views for explaining a fabrication method of the acoustic wave device of the first embodiment.

FIG. 2A is a top view of an acoustic wave device in accordance with the first embodiment, FIG. 2B is a cross-sectional view take along line A-A in FIG. 2A, and FIG. 2C is a cross-sectional view taken along line B-B in FIG. 2A. The first embodiment describes an FBAR (Film Bulk Acoustic Resonator) that is one of piezoelectric thin film resonators. As illustrated in FIG. 2A through FIG. 2C, an FBAR 20 includes a substrate 22, a lower electrode 24, a piezoelectric film 26, and an upper electrode 28.

The substrate 22 may be an insulative substrate such as a silicon (Si) substrate, a glass substrate, a gallium arsenide (GaAs) substrate, or a ceramic substrate. The lower electrode 24 is located on the substrate 22. The lower electrode 24 may be a metal film including at least one of aluminum (Al), copper (Cu), chrome (Cr), molybdenum (Mo), tungsten (W), tantalum (Ta), platinum (Pt), ruthenium (Ru), rhodium (Rh), and iridium (Ir) for example. The lower electrode 24 may have a single layer structure or a multilayer structure.

The piezoelectric film 26 is located on the substrate 22 and the lower electrode 24. The piezoelectric film 26 is an aluminum nitride (AlN) film containing a divalent element and a tetravalent element, and has a crystal structure with a c-axis orientation that has a c-axis as a main axis. The divalent element and the tetravalent element are substituted in aluminum sites of the aluminum nitride film. The upper electrode 28 is located on the piezoelectric film 26 so as to have a region facing the lower electrode 24. A resonance portion 30 is a region where the lower electrode 24 and the upper electrode 28 face each other across the piezoelectric film 26. The upper electrode 28 may be a metal film including at least one of Al, Cu, Cr, Mo, W, Ta, Pt, Ru, Rh, and Ir described for the lower electrode 24. The upper electrode may have a single layer structure or a multilayer structure.

A dome-shaped air-space 32 is located between the substrate 22 and the lower electrode 24 in the resonance portion 30. The dome-shaped air-space 32 has a height that becomes higher as it becomes closer to a center of the air-space 32. An introduction path 34 formed by introduction of etchant for forming the air-space 32 is located below the lower electrode 24. The piezoelectric film 26 or the like does not cover a vicinity of a tip of the introduction path 34, and the tip of the introduction path 34 forms a hole portion 36. The hole portion 36 is an inlet for introducing etchant to form the air-space 32. An aperture 38 is formed in the piezoelectric film 26 to provide an electrical connection with the lower electrode 24.

When a high frequency electrical signal is applied between the lower electrode 24 and the upper electrode 28, an acoustic wave excited by the inverse piezoelectric effect or an acoustic wave caused by a strain due to the piezoelectric effect is generated in the piezoelectric film 26 sandwiched by the lower electrode 24 and the upper electrode 28. The above-described acoustic wave is fully reflected at surfaces exposed to air of the lower electrode 24 and the upper electrode 28, and thus becomes a bulk acoustic wave having a main displacement in a thickness direction. That is to say, the lower electrode 24 and the upper electrode 28 function as electrodes exciting an acoustic wave propagating through the piezoelectric film 26.

A description will now be given of a fabrication method of the acoustic wave device of the first embodiment with reference to FIG. 3A through FIG. 3H. FIG. 3A through FIG. 3D are cross-sectional views corresponding to a cross-section taken along line A-A in FIG. 2A, and FIG. 3E through FIG. 3H are cross-sectional views corresponding to a cross-section taken along line B-B in FIG. 2A.

Figure 3A:
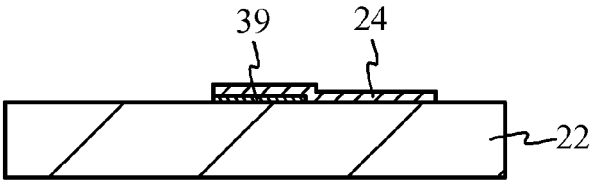
Figure 3B:
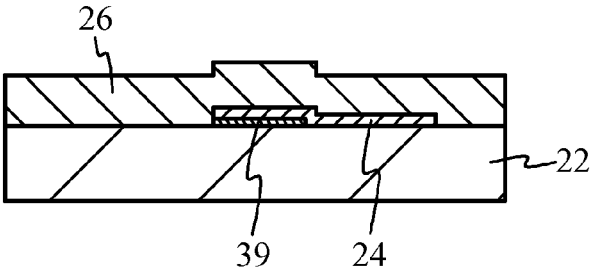
Figure 3C:
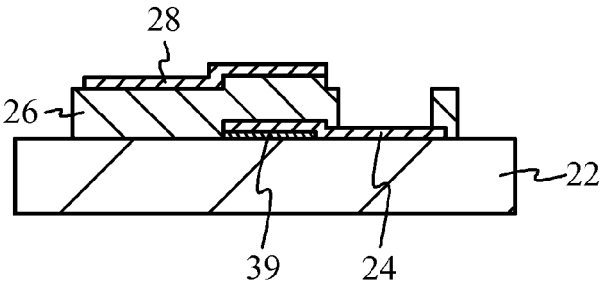
Figure 3D:
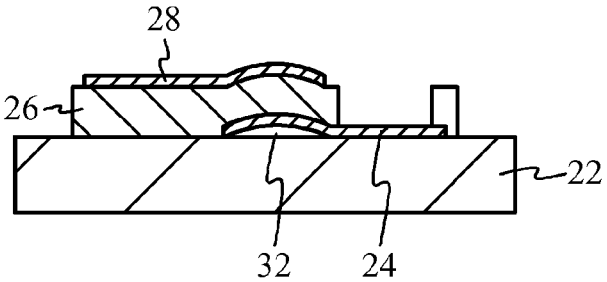
Figure 3E:
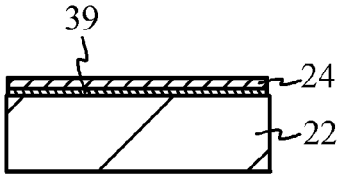

As illustrated in FIG. 3A and FIG. 3E, a sacrifice layer 39 is formed on the substrate 22 by sputtering or evaporation. The sacrifice layer 39 is made of magnesium oxide (MgO) for example, and is formed in at least a region in which the air-space 32 is to be formed. The sacrifice layer 39 may have a film thickness of 20 nm for example. A metal film is then formed on the substrate 22 and the sacrifice layer 39 by sputtering in an argon (Ar) gas atmosphere for example. The metal film is selected from at least one of Al, Cu, Cr, Mo, W, Ta, Pt, Ru, Rh, and Ir as described previously. Then, the metal film is shaped into a desired shape by exposure and etching to form the lower electrode 24. At this point, a part of the lower electrode 24 has a shape that covers the sacrifice layer 39.

Figure 3F:
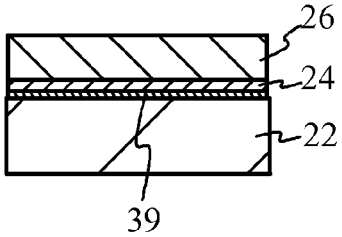

As illustrated in FIG. 3B and FIG. 3F, the piezoelectric film 26 made of an aluminum nitride (AlN) film is formed on the substrate 22 and the lower electrode 24 by sputtering an Al alloy target formed by incorporating a divalent element and a tetravalent element into Al in a mixed gas atmosphere of argon and nitrogen. Instead of sputtering the Al alloy target formed by incorporating a divalent element and a tetravalent element into Al, an Al target, a divalent element target, and a tetravalent element target may be simultaneously sputtered by multiple sputtering. In this case, atomic concentrations of the divalent element and the tetravalent element contained in the piezoelectric film 26 can be controlled by changing electrical power applied to each target.

Figure 3G:
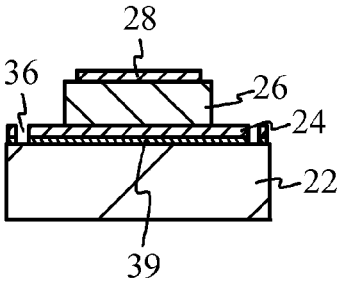

As illustrated in FIG. 3C and FIG. 3G, a metal film is then formed on the piezoelectric film 26 by sputtering in an argon gas atmosphere for example. The metal film is selected from at least one of Al, Cu, Cr, Mo, W, Ta, Pt, Ru, Rh, and Ir as described previously. The metal film is then shaped into a desired shape by exposure and etching to form the upper electrode 28. In addition, the piezoelectric film 26 is also shaped into a desired shape by exposure and etching for example. Furthermore, the hole portion 36 is formed by selectively etching the lower electrode 24 and the sacrifice layer 39.

Figure 3H:
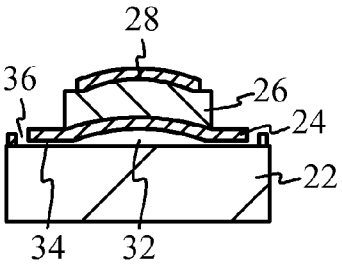

After the above process, as illustrated in FIG. 3D and FIG. 3H, etchant is introduced from the hole portion 36 to etch the sacrifice layer 39. Here, the stress to a multilayered film formed by the lower electrode 24, the piezoelectric film 26, and the upper electrode 28 is set to a compression stress by adjusting a sputtering condition. Thus, when the etching of the sacrifice layer 39 is completed, the multilayered film bulges out, and the dome-shaped air-space 32 is formed between the substrate 22 and the lower electrode 24. The introduction path 34 connecting the air-space 32 to the hole portion 36 is also formed. The above described fabrication process forms the acoustic wave device illustrated in FIG. 2.

A description will now be given of a simulation conducted to investigate an effective electromechanical coupling coefficient $k_{eff}^2$ (hereinafter, referred to as $k_{eff}^2$) of the FBAR of the first embodiment. The simulation uses calculated values by the first principle calculation for the piezoelectric constant, the elastic constant, and the permittivity of the piezoelectric film 26 made of an aluminum nitride film containing a divalent element and a tetravalent element. A description will now be given of a simulation performed to a first FBAR and a second FBAR having the following configuration.

The first FBAR uses a multilayered metal film including Cr with a film thickness of 100 nm and Ru with a film thickness of 225 nm stacked in this order from the substrate 22 side for the lower electrode 24. The piezoelectric film 26 is an aluminum nitride film that contains Mg as a divalent element and Hf as a tetravalent element and has a film thickness of 1000 nm. Substitutional concentrations of Mg and Hf are set to 6.25 atomic %. The upper electrode 28 is a multilayered metal film including Ru with a film thickness of 225 nm and Cr with a film thickness of 30 nm stacked in this order from the substrate 22 side. In addition, a silicon dioxide ($SiO_2$) film with a film thickness of 50 nm is located on the upper electrode 28.

The second FBAR uses an aluminum nitride film having a film thickness of 1000 nm and containing Mg as a divalent element and Ti as a tetravalent element for the piezoelectric film 26. Other configurations are the same as those of the first FBAR. Substitutional concentrations of Mg and Ti are set to 6.25 atomic %.

For comparison, the simulation is also performed to a first comparative example that has the same configuration as those of the first FBAR and the second FBAR except that a non-doped aluminum nitride film with a film thickness of 1150 nm is used for the piezoelectric film.

Figure 4A:
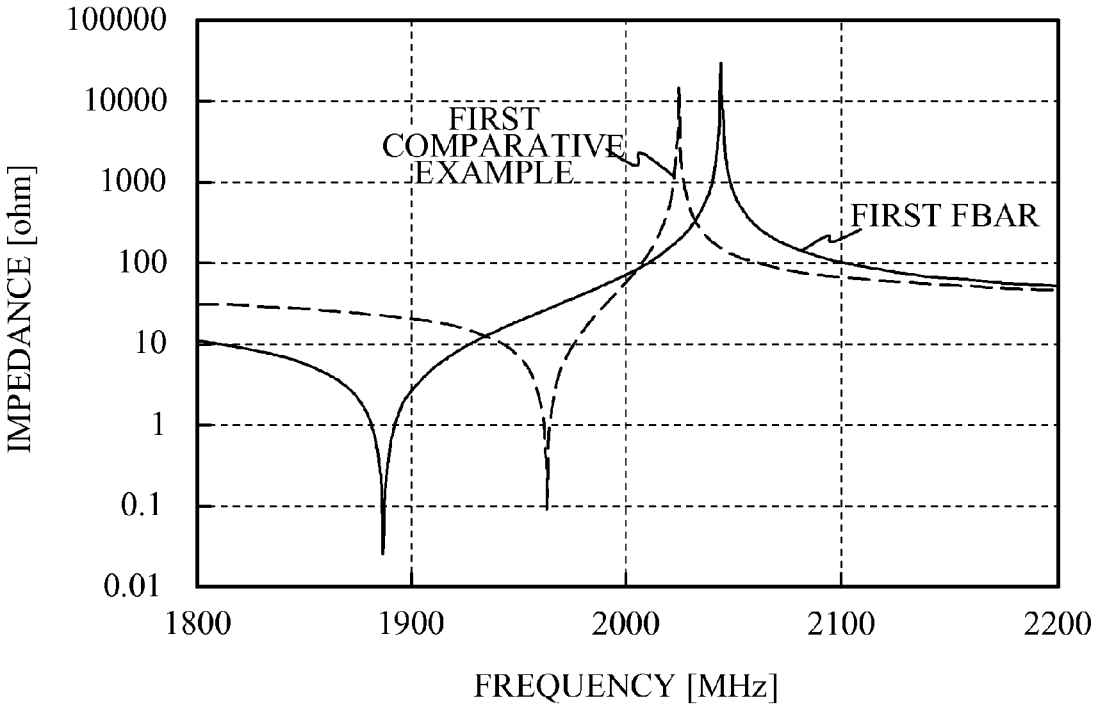
FIG. 4A illustrates simulation results of a resonance characteristic of a first FBAR.
Figure 4B:
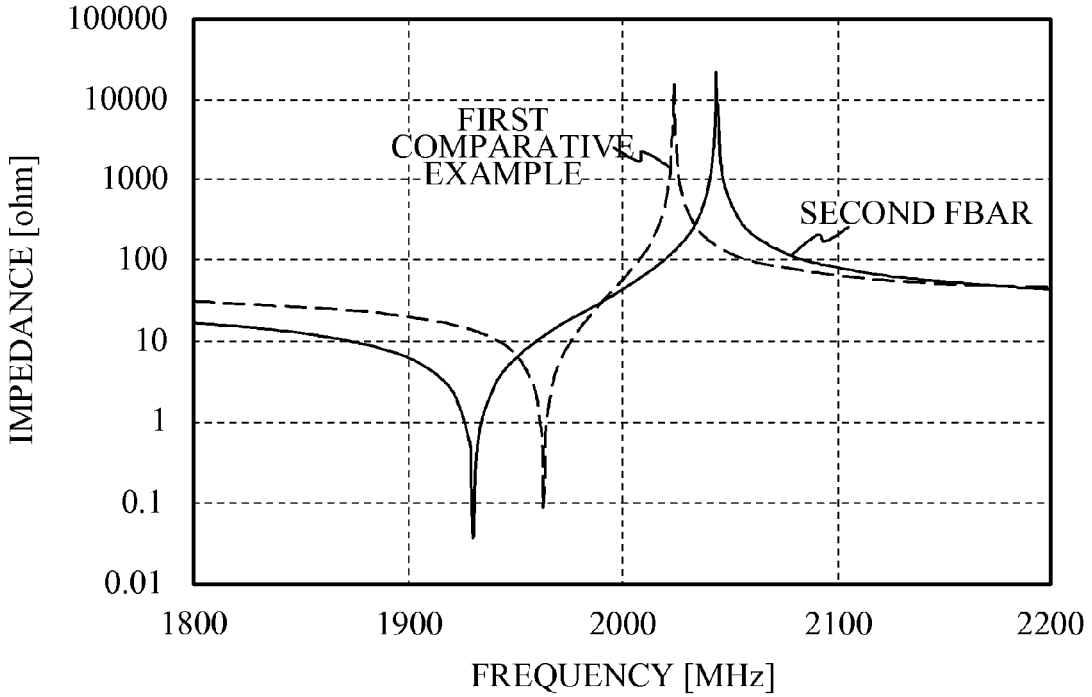
FIG. 4B illustrates simulation results of a resonance characteristic of a second FBAR.

FIG. 4A illustrates simulation results of a resonance characteristic of the first FBAR, and FIG. 4B illustrates simulation results of a resonance characteristic of the second FBAR. A solid line indicates the resonance characteristic of the first FBAR in FIG. 4A and the resonance characteristic of the second FBAR in FIG. 4B, and dashed lines indicate a resonance characteristic of the first comparative example. As illustrated in FIG. 4A and FIG. 4B, an interval between a resonance frequency and an anti-resonance frequency is wide in the first FBAR and the second FBAR compared to that in the first comparative example. Effective electromechanical coupling coefficients $k_{eff}^2$ of the first FBAR, the second FBAR, and the first comparative example are 17.5%, 12.9%, and 7.22%, respectively.

In addition, simulated are FBARs using various kinds of elements for the divalent element and the tetravalent element contained in the piezoelectric film 26 in the same manner. Table 3 presents simulation results. Substitutional concentrations of the divalent element and the tetravalent element are set to 6.25 atomic %, and configurations other than the kinds of the divalent element and the tetravalent element are made to be the same as those of the first FBAR and the second FBAR.

TABLE 3

| Combination | Divalent element | Tetravalent element | Resonance frequency [MHz] | Anti-resonance frequency [MHz] | $k_{eff}^2$ [%] |
|---|---|---|---|---|---|
| Case 1 | Ca | Ti | 1928.9 | 2011.9 | 9.77 |
| Case 2 | Ca | Zr | 1895.8 | 1983.2 | 10.4 |
| Case 3 | Ca | Hf | 1875.7 | 1998.3 | 14.2 |
| Case 4 | Mg | Ti | 1930.3 | 2043.8 | 12.9 |
| Case 5 | Mg | Zr | 1911.9 | 2030.3 | 13.5 |
| Case 6 | Mg | Hf | 1886.9 | 2043.9 | 17.5 |
| Case 7 | Sr | Hf | 1901.5 | 1998.3 | 11.4 |
| Case 8 | Zn | Ti | 1940.1 | 2050.4 | 12.6 |
| Case 9 | Zn | Zr | 1888.3 | 1995.0 | 12.5 |
| Case 10 | Zn | Hf | 1887.5 | 2027.7 | 15.9 |
| Aluminum nitride | — | — | 1963.0 | 2024.0 | 7.22 |

As presented in Table 3, the obtained results demonstrate that the acoustic wave devices using an aluminum nitride film containing a divalent element and a tetravalent element for the piezoelectric film (Case 1 through Case 10) have effective electromechanical coupling coefficients $k_{eff}^2$ greater than that of the acoustic wave device using a non-doped aluminum nitride film for the piezoelectric film (Table 3: Aluminum nitride). A combination of the divalent element and the tetravalent element may be Ca—Ti, Ca—Zr, Ca—Hf, Mg—Ti, Mg—Zr, Mg—Hf, Sr—Hf, Zn—Ti, Zn—Zr, or Zn—Hf as presented in Table 3, and may be other combinations.

The first embodiment demonstrates that an acoustic wave device having a high electromechanical coupling coefficient can be obtained by using an aluminum nitride film containing a divalent element and a tetravalent element for the piezoelectric film 26.

The piezoelectric film 26 contains one of Ca, Mg, Sr, and Zn as the divalent element in the simulation results presented in Table 3, but may contain two or more of these divalent elements. Moreover, the piezoelectric film 26 contains one of Ti, Zr, and Hf as the tetravalent element, but may contain two or more of these tetravalent elements. That is to say, the piezoelectric film 26 may contain at least one of Ca, Mg, Sr, and Zn as the divalent element and at least one of Ti, Zr, and Hf as the tetravalent element. In addition, the piezoelectric film 26 may contain a divalent element and a tetravalent element other than those cited in Table 3.

A description will now be given of an insulation property of doped AlN doped with a divalent element and a tetravalent element (hereinafter, referred to as first doped AlN). The insulation property was evaluated by calculating an electronic state of the first doped AlN by the first principle calculation, and drawing a band diagram. For comparison, evaluated were an insulation property of doped AlN doped with only a divalent element (hereinafter, referred to as second doped AlN) and an insulation property of doped AlN doped with only a tetravalent element (hereinafter, referred to as third doped AlN) in the same manner. The first doped AlN, the second doped AlN, and the third doped AlN have the following crystal structures.

The first doped AlN is doped AlN formed by substituting a divalent element in one of the aluminum atoms 10 and substituting a tetravalent element in another one of the aluminum atoms 10 in the non-doped AlN with the wurtzite-type crystal structure described in FIG. 1. Thus, a ratio of substitutional concentrations of the divalent element to the tetravalent element is 1:1. Mg is used as the divalent element, and Hf is used as the tetravalent element.

The second doped AlN is doped AlN formed by substituting a divalent element in one of the aluminum atoms 10 in the non-doped AlN with the wurtzite-type crystal structure described in FIG. 1. Mg is used as the divalent element.

The third doped AlN is doped AlN formed by substituting a tetravalent element in one of the aluminum atoms 10 in the non-doped AlN with the wurtzite-type crystal structure described in FIG. 1. Hf is used as the tetravalent element.

Figure 5:
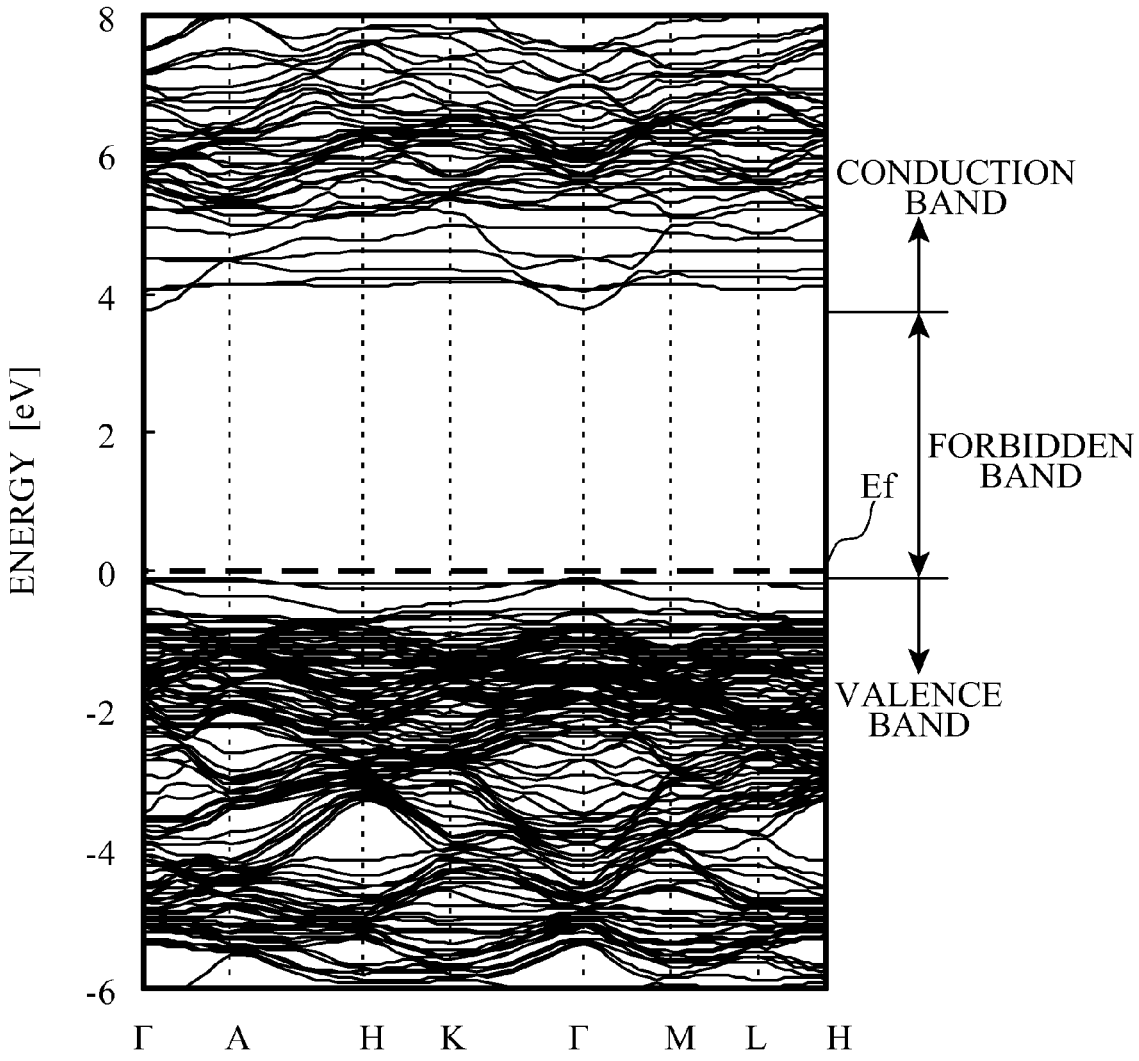
FIG. 5 illustrates simulation results of a band structure of first doped aluminum nitride.
Figure 6:
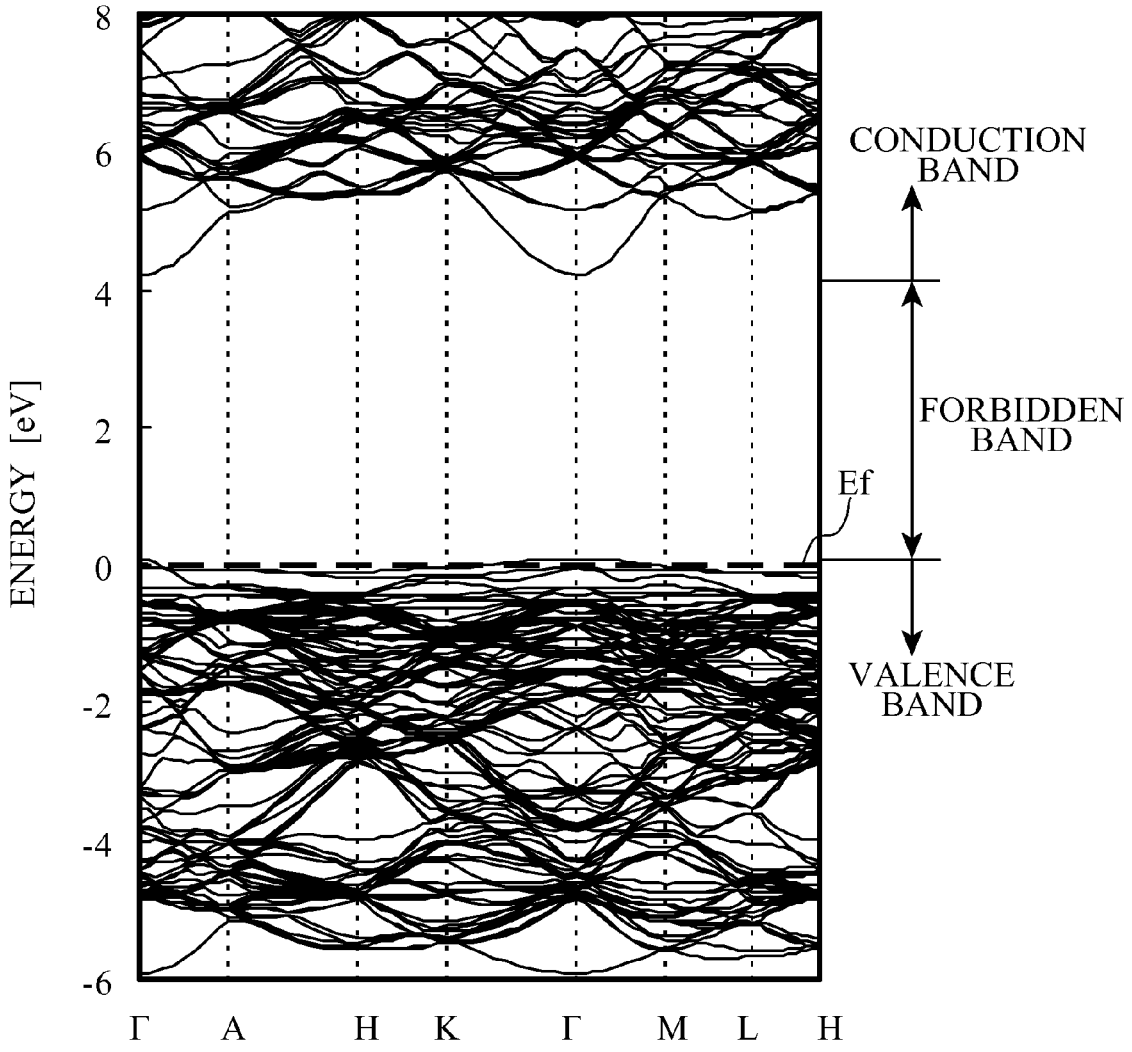
FIG. 6 illustrates simulation results of a band structure of second doped aluminum nitride.
Figure 7:
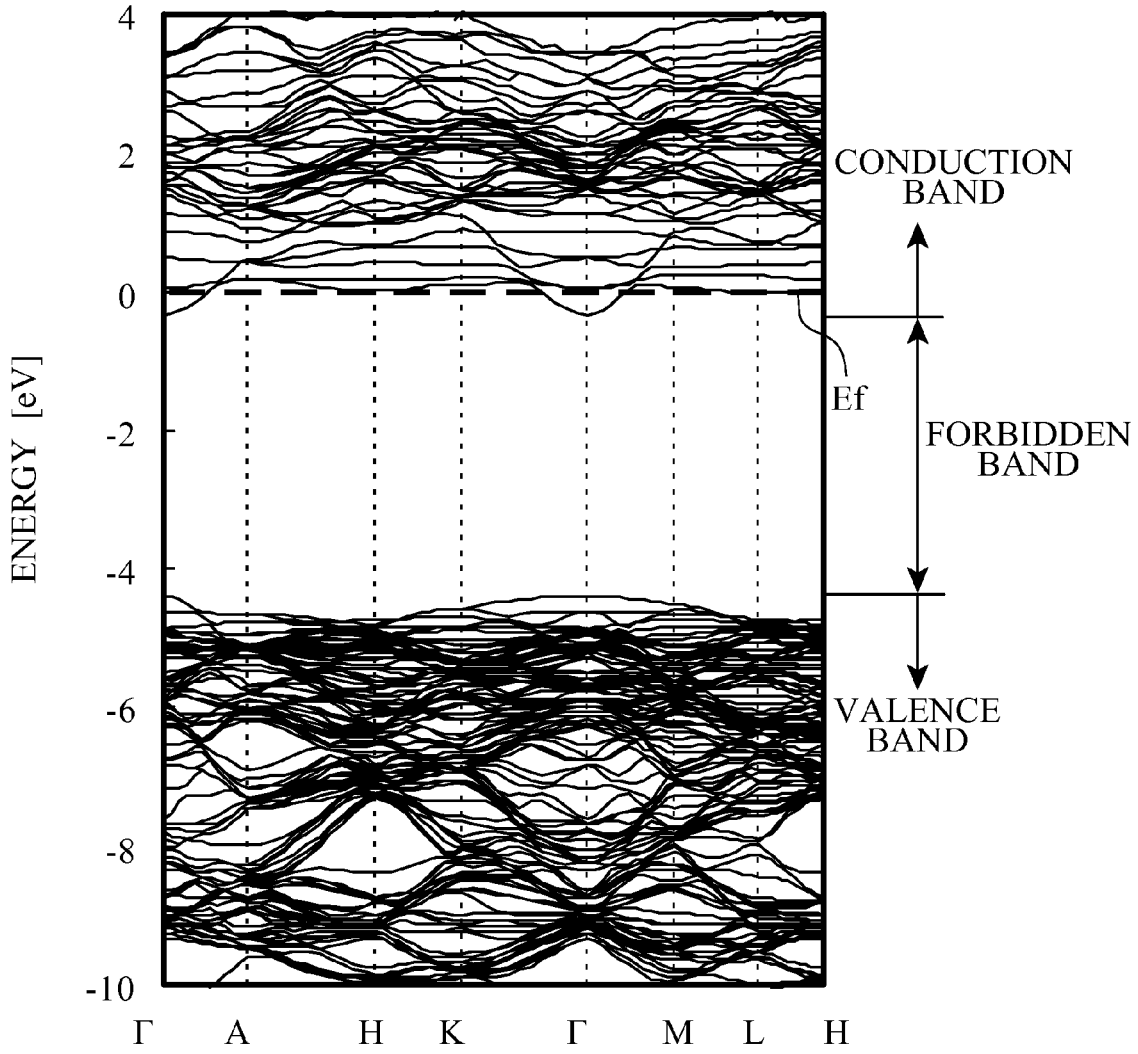
FIG. 7 illustrates simulation results of a band structure of third doped aluminum nitride.

FIG. 5 illustrates simulation results of a band structure of the first doped AlN. FIG. 6 illustrates simulation results of a band structure of the second doped AlN. FIG. 7 illustrates simulation results of a band structure of the third doped AlN. In FIG. 5 through FIG. 7, solid lines indicate energy levels, a band of energy levels at a lower side represents a valence band, and a band of energy levels at an upper side represents a conduction band. A forbidden band is between the valence band and the conduction band. A dashed line indicates Fermi energy (hereinafter, abbreviated as Ef).

When AlN is doped with only Mg as a divalent element, the Fermi energy Ef is located below a top of the valence band, and thus lies in the valence band as illustrated in FIG. 6. This reveals that the insulation property degrades when AlN is doped with only a divalent element. When AlN is doped with only Hf as a tetravalent element, the Fermi energy Ef is located above a bottom of the conduction band, and thus lies in the conduction band as illustrated in FIG. 7. This reveals that the insulation property also degrades when AlN is doped with only a tetravalent element.

On the other hand, when AlN is doped with Mg as a divalent element and Hf as a tetravalent element at a ratio of 1:1, the Fermi energy Ef lies in the forbidden band between the top of the valence band and the bottom of the conduction band as illustrated in FIG. 5. This reveals that the insulation property can be maintained by doping AlN with a divalent element and a tetravalent element, and making a ratio of substitutional concentrations of the divalent element to the tetravalent element 1:1. This is because an electric property of the doped AlN can remain neutral by making a ratio of substitutional concentrations of the divalent element to the tetravalent element 1:1 because both the divalent element and the tetravalent element are substituted in trivalent aluminum sites. FIG. 5 illustrates a case where Mg is used as the divalent element and Hf is used as the tetravalent element, but the insulation property can be also maintained when other divalent elements and tetravalent elements are used.

Therefore, an acoustic wave device that can maintain the insulation property of the piezoelectric film 26 and have a high electromechanical coupling coefficient can be obtained by using an aluminum nitride film containing a divalent element and a tetravalent element at a ratio of 1:1 for the piezoelectric film 26 in the FBAR of the first embodiment. The ratio of substitutional concentrations of the divalent element and the tetravalent element is preferably 1:1 to the extent that the electric property of the piezoelectric film can remain neutral.

Figure 8:
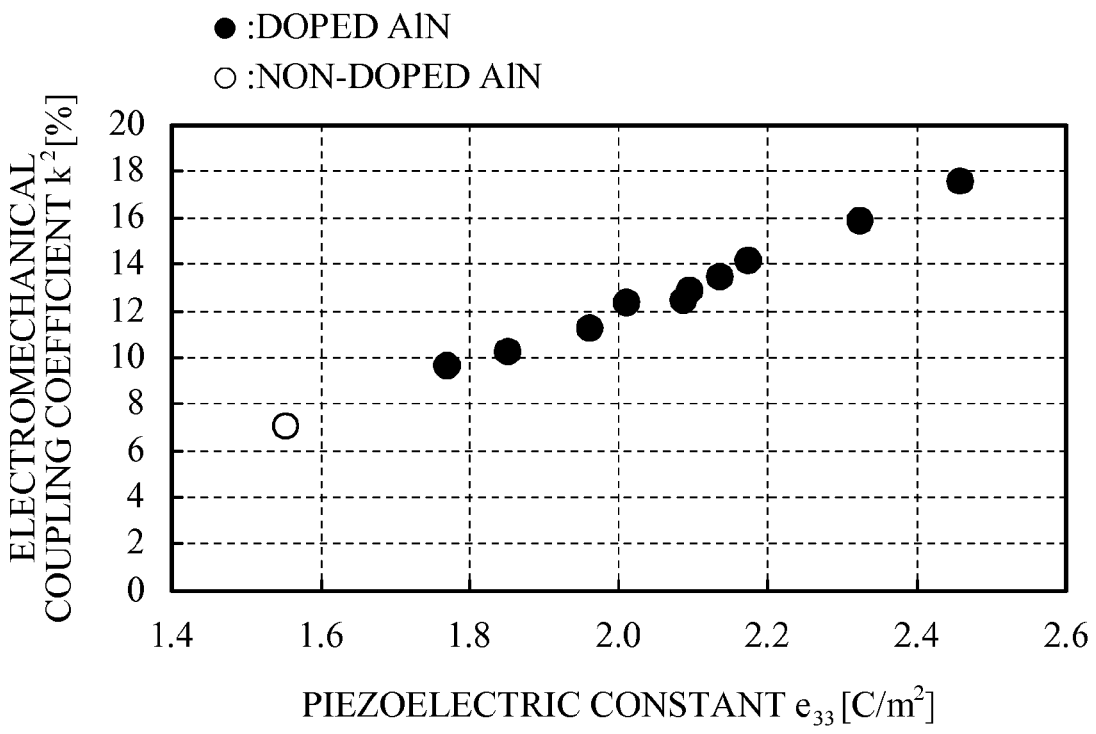
FIG. 8 illustrates a relationship between a piezoelectric constant $e_{33}$ and an electromechanical coupling coefficient $k^2$.

Next, a description will be given of a relationship between a piezoelectric constant $e_{33}$ and an electromechanical coupling coefficient $k^2$ of doped AlN doped with a divalent element and a tetravalent element. The piezoelectric constant $e_{33}$ of the doped AlN is calculated by the first principle calculation, and the electromechanical coupling coefficient $k^2$ is calculated from Expression 1. FIG. 8 illustrates a relationship between a piezoelectric constant $e_{33}$ and an electromechanical coupling coefficient $k^2$ with respect to the doped AlN of Case 1 through Case 10 presented in Table 2 and the non-doped AlN. In FIG. 8, the open circle indicates a result of the non-doped AlN, and black circles indicate results of the doped AlN. As illustrated in FIG. 8, all doped AlN doped with a divalent element and a tetravalent element have piezoelectric constants $e_{33}$ greater than that of the non-doped AlN, and the electromechanical coupling coefficient $k^2$ increases as the piezoelectric constant $e_{33}$ increases. This reveals that the FBAR of the first embodiment preferably uses an aluminum nitride film containing a divalent element and a tetravalent element and having a piezoelectric constant $e_{33}$ greater than 1.55, which is the piezoelectric constant $e_{33}$ of aluminum nitride, for the piezoelectric film 26. The above configuration allows the piezoelectric film 26 to have a high electromechanical coupling coefficient, and accordingly allows an acoustic wave device having a high electromechanical coupling coefficient to be obtained.

As illustrated in FIG. 8, the piezoelectric film 26 preferably has a piezoelectric constant $e_{33}$ greater than 1.6, more preferably 1.8 because the electromechanical coupling coefficient $k^2$ increases as the piezoelectric constant $e_{33}$ increases.

Figure 9:
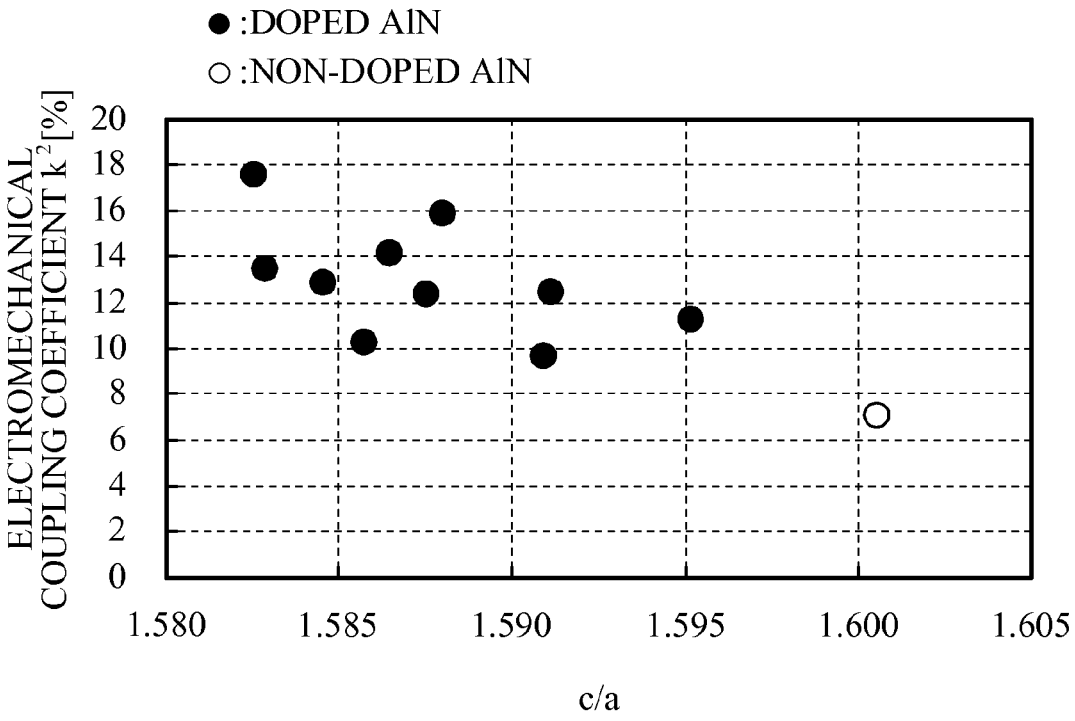
FIG. 9 illustrates a relationship between a ratio (c/a) of a lattice constant in a c-axis direction to a lattice constant in an a-axis direction and an electromechanical coupling coefficient $k^2$.

A description will now be given of a relationship between a crystal structure and an electromechanical coupling coefficient $k^2$ of doped AlN doped with a divalent element and a tetravalent element. The crystal structure of the doped AlN is evaluated with a ratio (c/a) of a lattice constant in the c-axis direction to a lattice constant in the a-axis direction calculated by the first principle calculation. The electromechanical coupling coefficient $k^2$ is calculated by assigning calculated values of the piezoelectric constant and the like of the doped AlN by the first principle calculation to Expression 1. FIG. 9 illustrates a relationship between a c/a ratio and an electromechanical coupling coefficient $k^2$ with respect to the doped AlN of Case 1 through Case 10 presented in Table 2 and the non-doped AlN. In FIG. 9, the open circle indicates a result of the non-doped AlN, and black circles indicate results of the doped AlN. As illustrated in FIG. 9, all doped AlN doped with a divalent element and a tetravalent element have c/a ratios less than that of the non-doped AlN, and the electromechanical coupling coefficient $k^2$ increases as the c/a ratio decreases. This reveals that the FBAR of the first embodiment preferably uses an aluminum nitride film containing a divalent element and a tetravalent element and having a c/a ratio less than 1.6, which is the c/a ratio of aluminum nitride, for the piezoelectric film 26. The above configuration allows the piezoelectric film 26 to have a high electromechanical coupling coefficient, and accordingly allows an acoustic wave device having a high electromechanical coupling coefficient to be obtained.

As illustrated in FIG. 9, the piezoelectric film 26 preferably has a c/a ratio less than 1.595, more preferably 1.59 because the electromechanical coupling coefficient $k^2$ increases as the c/a ratio decreases.

A description will now be given of a dependence of an electromechanical coupling coefficient $k^2$ on substitutional concentrations of doped AlN doped with a divalent element and a tetravalent element. The dependence of the electromechanical coupling coefficient $k^2$ on substitutional concentrations is evaluated by calculating a size of the supercell of the wurtzite-type crystal structure described in FIG. 1 and electronic states of doped AlN with different numbers of aluminum atoms substituted by a divalent element and a tetravalent element by the first principle calculation. Substitutional concentrations of the divalent element and the tetravalent element are made to be equal to each other to make the electric properties of the doped AlN neutral.

Figure 10A:
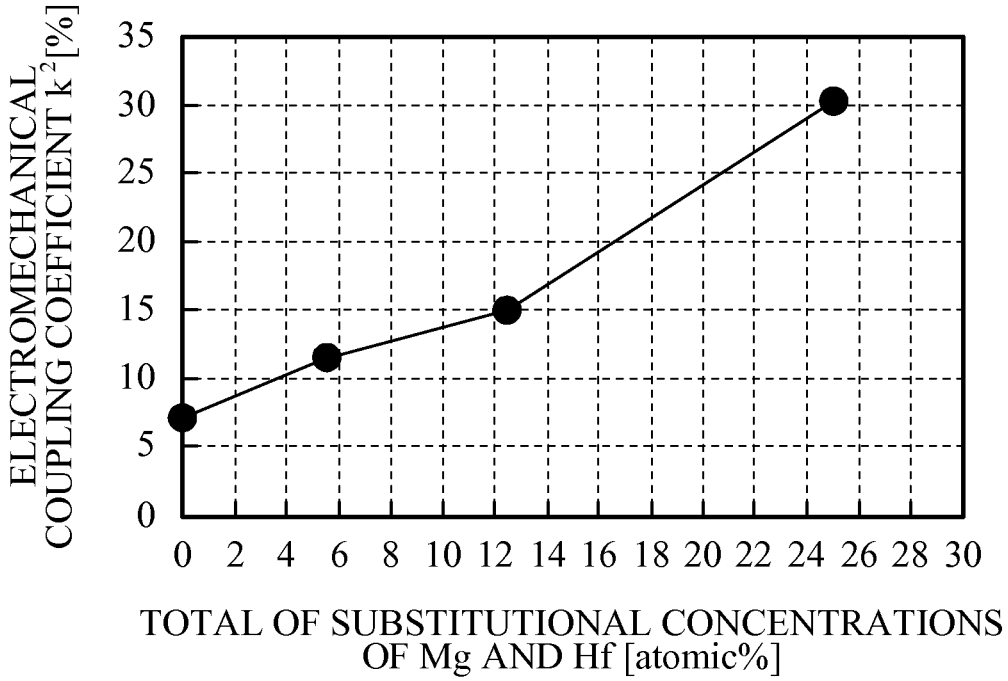
FIG. 10A illustrates a dependence of an electromechanical coupling coefficient $k^2$ on substitutional concentrations when magnesium is used as a divalent element and hafnium is used as a tetravalent element.
Figure 10B:
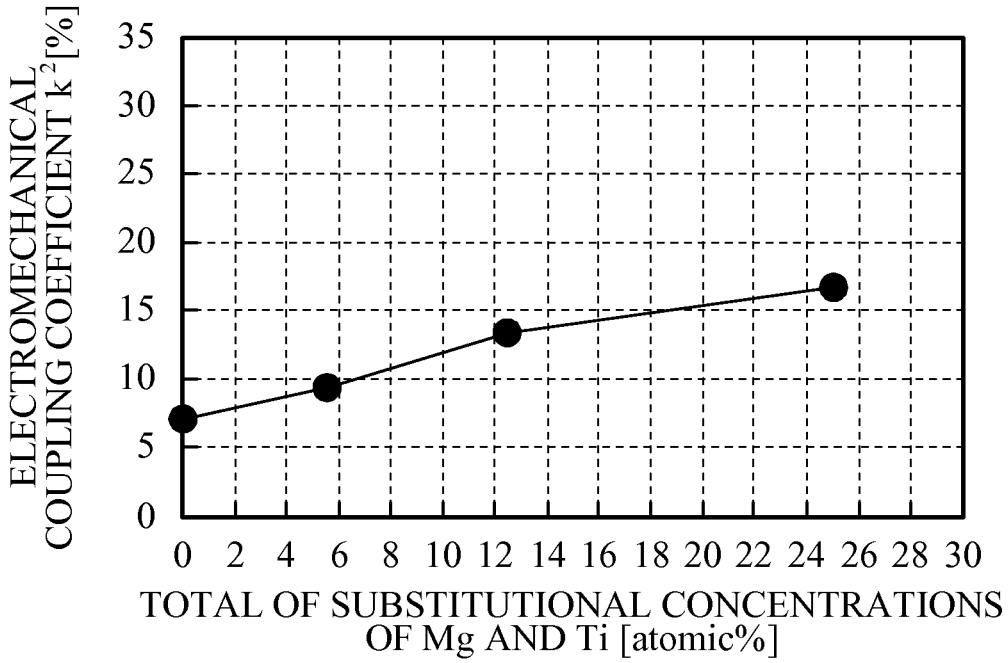
FIG. 10B illustrates a dependence of an electromechanical coupling coefficient $k^2$ on substitutional concentrations when magnesium is used as a divalent element and titanium is used as a tetravalent element.

FIG. 10A illustrates a dependence of an electromechanical coupling coefficient $k^2$ on substitutional concentrations when Mg is used as the divalent element and Hf is used as the tetravalent element, FIG. 10B illustrates a dependence of an electromechanical coupling coefficient $k^2$ on substitutional concentrations when Mg is used as the divalent element and Ti is used as the tetravalent element. FIG. 10A and FIG. 10B reveal that the electromechanical coupling coefficient $k^2$ of the doped AlN increases as the substitutional concentrations increase not only when Mg and Hf are used but also when Mg and Ti are used. This result reveals that the electromechanical coupling coefficient $k^2$ can be controlled to be a desired value by controlling the substitutional concentrations. For example, doped AlN with an electromechanical coupling coefficient $k^2$ of 10% can be obtained by controlling a total of substitutional concentrations of Mg and Hf to be approximately 4 atomic %, or by controlling a total of substitutional concentrations of Mg and Ti to be approximately 7 atomic %. The simulation uses Mg as the divalent element and Ti or Hf as the tetravalent element, but other divalent elements and tetravalent elements may be used.

Thus, an acoustic wave device having a desired electromechanical coupling coefficient can be obtained by controlling substitutional concentrations of the divalent element and the tetravalent element contained in the piezoelectric film 26 in the FBAR of the first embodiment.

Figure 11:
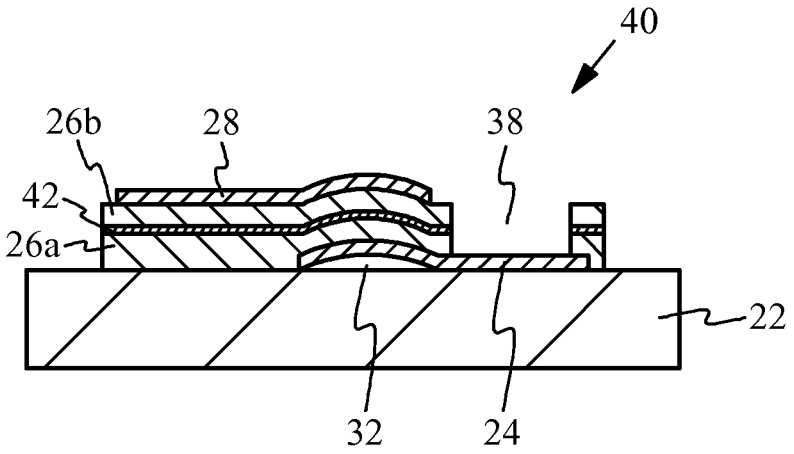
FIG. 11 is a cross-sectional view of an acoustic wave device in accordance with a first variation of the first embodiment.

A description will now be given of an acoustic wave device in accordance with a first variation of the first embodiment. FIG. 11 illustrates a cross-sectional view of the acoustic wave device of the first variation of the first embodiment. As illustrated in FIG. 11, an FBAR 40 of the first variation of the first embodiment includes a temperature compensation film 42 inserted so as to be sandwiched by piezoelectric films 26a and 26b. The temperature compensation film 42 is located between the piezoelectric films 26a and 26b, and contacts the piezoelectric films 26a and 26b. The temperature compensation film 42 is formed of a material having a temperature coefficient of an elastic constant opposite in sign to those of the piezoelectric films 26a and 26b. For example, when the temperature coefficients of the piezoelectric films 26a and 26b are negative, the temperature compensation film 42 with a positive temperature coefficient is used. Other configurations are the same as those of the first embodiment, and thus a description thereof is omitted.

Provision of the above described temperature compensation film 42 allows a temperature characteristic of the FBAR 40 to be improved. A silicon oxide ($SiO_2$) film is an example of the temperature compensation film 42. Instead of the $SiO_2$ film, a film mainly containing silicon oxide, e.g. a silicon oxide film doped with an element such as fluorine (F), may be used. Here, "a film mainly containing . . . " means a film that contains an element to the extent that the temperature coefficient of the elastic constant of the temperature compensation film 42 becomes opposite in sign to those of the piezoelectric films 26a and 26b.

A description will be given of a simulation conducted to investigate an effective electromechanical coupling coefficient $k_{eff}^2$ of the FBAR 40 of the first variation of the first embodiment. As with the first embodiment, the calculated values by the first principle calculation are used for the piezoelectric constants, the elastic constants, and the permittivities of the piezoelectric films 26a and 26b that are aluminum nitride films containing a divalent element and a tetravalent element. A description will be given of a simulation performed to a third FBAR and a fourth FBAR having the following configurations.

The third FBAR uses a multilayered metal film including Cr with a film thickness of 100 nm and Ru with a film thickness of 225 nm stacked in this order from the substrate 22 side for the lower electrode 24. The piezoelectric films 26a and 26b are aluminum nitride films having a film thickness of 400 nm and containing Mg as a divalent element and Hf as a tetravalent element. Substitutional concentrations of Mg and Hf are set to 6.25 atomic %. A $SiO_2$ film with a film thickness of 50 nm is used for the temperature compensation film 42. The upper electrode 28 is a multilayered metal film including Ru with a film thickness of 225 nm and Cr with a film thickness of 30 nm stacked in this order from the substrate 22 side. A $SiO_2$ film with a film thickness of 50 nm is located on the upper electrode 28.

The fourth FBAR uses an aluminum nitride film having a film thickness of 400 nm and containing Mg as a divalent element and Ti as a tetravalent element for the piezoelectric films 26a and 26b. Other configurations are the same as those of the third FBAR. Substitutional concentrations of Mg and Ti are set to 6.25 atomic %.

For comparison, the simulation is also performed to a second comparative example that has the same configuration as those of the third FBAR and the fourth FBAR except that a non-doped aluminum nitride film with a film thickness of 475 nm is used for the piezoelectric film.

Figure 12A:
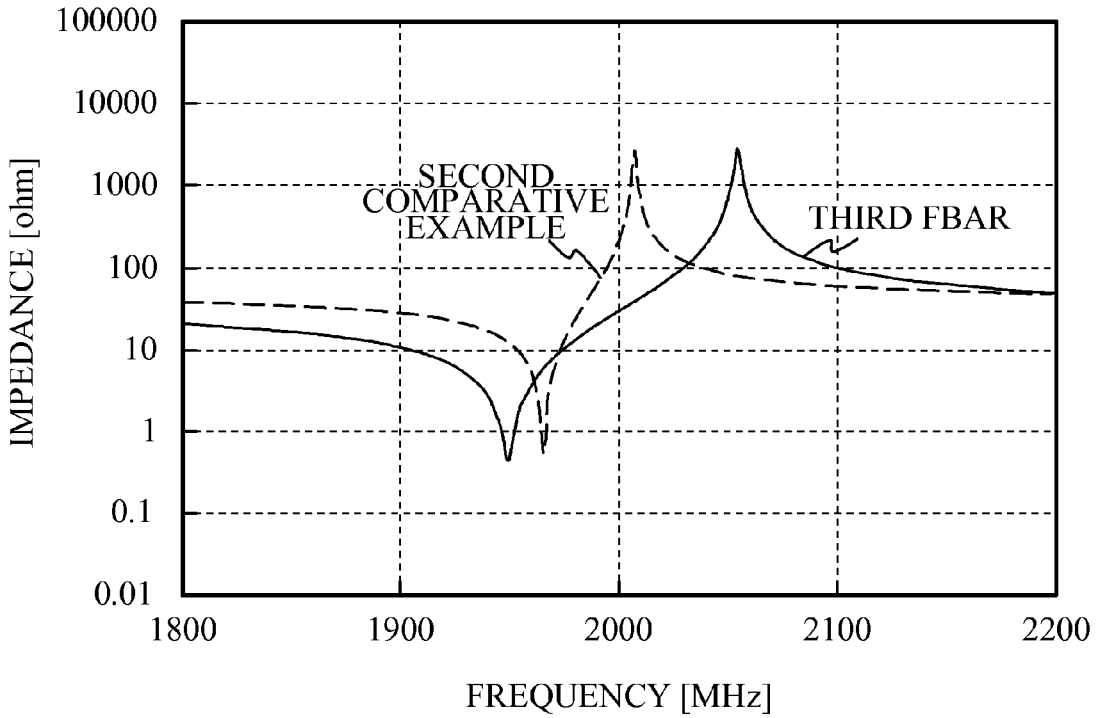
FIG. 12A illustrates simulation results of a resonance characteristic of a third FBAR.
Figure 12B:
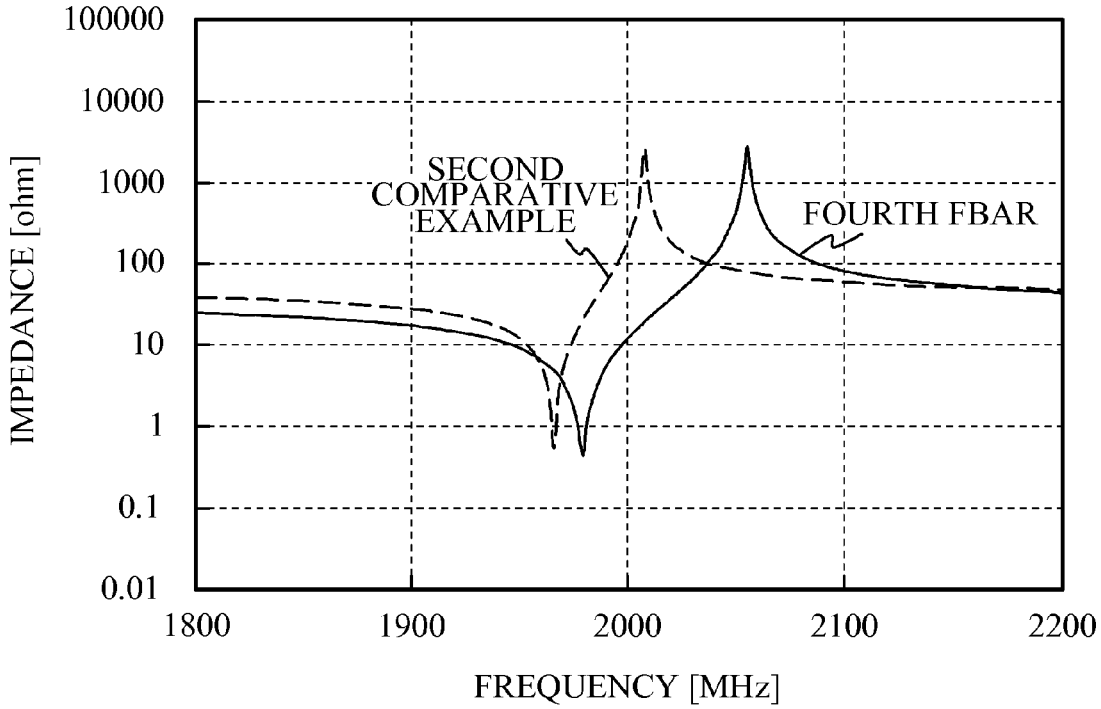
FIG. 12B illustrates simulation results of a resonance characteristic of a fourth FBAR.

FIG. 12A illustrates simulation results of a resonance characteristic of the third FBAR, and FIG. 12B illustrates simulation results of a resonance characteristic of the fourth FBAR. A solid line indicates the resonance characteristic of the third FBAR in FIG. 12A and the resonance characteristic of the fourth FBAR in FIG. 12B, and a dashed line indicates a resonance characteristic of the second comparative example. As illustrated in FIG. 12A and FIG. 12B, an interval between a resonance frequency and an anti-resonance frequency is wide in the third FBAR and the fourth FBAR compared to that in the second comparative example. The effective electromechanical coupling coefficients $k_{eff}^2$ of the third FBAR, the fourth FBAR, and the second comparative example are 12.0%, 8.78%, and 5.01%, respectively.

Also simulated are FBARs using various kinds of elements for the divalent element and the tetravalent element contained in the piezoelectric films 26a and 26b in the same manner. Table 4 presents simulation results. Substitutional concentrations of the divalent element and the tetravalent element are set to 6.25 atomic %, and the configurations other than the kinds of the divalent element and the tetravalent element are the same as those of the third FBAR and the fourth FBAR.

TABLE 4

| Combination | Divalent element | Tetravalent element | Resonance frequency [MHz] | Anti-resonance frequency [MHz] | $k_{eff}^2$ [%] |
|---|---|---|---|---|---|
| Case 1 | Ca | Ti | 1973.7 | 2029.8 | 6.63 |
| Case 2 | Ca | Zr | 1948.0 | 2007.2 | 7.05 |
| Case 3 | Ca | Hf | 1938.8 | 2018.9 | 9.40 |
| Case 4 | Mg | Ti | 1978.5 | 2054.4 | 8.78 |
| Case 5 | Mg | Zr | 1964.4 | 2043.9 | 9.22 |
| Case 6 | Mg | Hf | 1949.0 | 2054.3 | 12.0 |
| Case 7 | Sr | Hf | 1953.8 | 2019.1 | 7.71 |
| Case 8 | Zn | Ti | 1986.1 | 2059.6 | 8.49 |
| Case 9 | Zn | Zr | 1944.0 | 2016.4 | 8.53 |
| Case 10 | Zn | Hf | 1947.5 | 2041.8 | 10.9 |

TABLE 4-continued

| Combination | Divalent element | Tetravalent element | Resonance frequency [MHz] | Anti-resonance frequency [MHz] | $k_{eff}^2$ [%] |
|---|---|---|---|---|---|
| Aluminum nitride | — | — | 1965.3 | 2007.0 | 5.01 |

As presented in Table 4, even when the temperature compensation film 42 is provided, the acoustic wave devices using an aluminum nitride film containing a divalent element and a tetravalent element for the piezoelectric film (Case 1 through Case 10) have effective electromechanical coupling coefficients $k_{eff}^2$ greater than that of the acoustic wave device using a non-doped aluminum nitride film for the piezoelectric film (Table 4: Aluminum nitride). A combination of the divalent element and the tetravalent element may be Ca—Ti, Ca—Zr, Ca—Hf, Mg—Ti, Mg—Zr, Mg—Hf, Sr—Hf, Zn—Ti, Zn—Zr, or Zn—Hf as presented in Table 4, but may be other combinations.

The first variation of the first embodiment demonstrates that an acoustic wave device having a high electromechanical coupling coefficient can be obtained by using an aluminum nitride film containing a divalent element and a tetravalent element for the piezoelectric films 26a and 26b even when the temperature compensation film 42 is included.

Second Embodiment

A second embodiment is an exemplary acoustic wave device that uses an aluminum nitride film containing a divalent element and a pentavalent element for the piezoelectric film. A description will first be given of a simulation performed to doped AlN doped with a divalent element and a pentavalent element with the first principle calculation. The simulation is performed to doped AlN with a crystal structure formed by substituting a divalent element in two of the aluminum atoms 10 and substituting a pentavalent element in another one of the aluminum atoms 10 in the non-doped AlN with the wurtzite-type crystal structure described in FIG. 1. That is to say, a part of the aluminum sites is substituted by a divalent element and a pentavalent element, and simulated is the doped AlN with the wurtzite-type crystal structure containing thirteen aluminum atoms, two divalent elements, one pentavalent element, and sixteen nitrogen atoms. Therefore, the substitutional concentration of the divalent element is 12.5 atomic %, and the substitutional concentration of the pentavalent element is 6.25 atomic %. Mg or Zn is used as the divalent element, and tantalum (Ta), niobium (Nb), or vanadium (V) is used as the pentavalent element.

Table 5 presents calculated values of piezoelectric constants $e_{33}$ and electromechanical coupling coefficients $k^2$ calculated from Expression 1 of the non-doped AlN and the doped AlN. As presented in Table 5, the obtained results demonstrate that the doped AlN doped with a divalent element and a pentavalent element (Case 1 through Case 6) have piezoelectric constants $e_{33}$ and electromechanical coupling coefficients $k^2$ greater than those of the non-doped AlN (Table 5: Non-doped AlN). A combination of the divalent element and the pentavalent element may be Mg—Ta, Mg—Nb, Mg—V, Zn—Ta, Zn—Nb, or Zn—V as presented in Table 5, but may be other combinations.

TABLE 5

| Combination | Divalent element | Pentavalent element | Piezoelectric constant $e_{33}$ [C/m$^2$] | Electromechanical coupling coefficient $k^2$ [%] |
|---|---|---|---|---|
| Case 1 | Mg | Ta | 2.52 | 19.3 |
| Case 2 | Mg | Nb | 2.22 | 14.4 |
| Case 3 | Mg | V | 2.33 | 18.1 |
| Case 4 | Zn | Ta | 2.22 | 14.3 |
| Case 5 | Zn | Nb | 2.12 | 13.6 |
| Case 6 | Zn | V | 2.12 | 10.8 |
| Non-doped AlN | — | — | 1.55 | 7.12 |

As described above, the inventors have newly found that doped AlN containing a divalent element and a pentavalent element also has an electromechanical coupling coefficient $k^2$ greater than that of non-doped AlN. A description will now be given of the second embodiment capable of obtaining an acoustic wave device having a high electromechanical coupling coefficient $k^2$ based on the above knowledge.

The acoustic wave device of the second embodiment has the same configuration as that of the first embodiment except that the piezoelectric film 26 is an aluminum nitride film containing a divalent element and a pentavalent element, and thus a description thereof is omitted. The divalent element and the pentavalent element are substituted in aluminum sites of the aluminum nitride film. The piezoelectric film 26 has a crystal structure having a c-axis orientation as with that of the first embodiment.

A fabrication method of the acoustic wave device of the second embodiment is the same as that of the first embodiment except that the piezoelectric film 26 is formed with an Al alloy target formed by incorporating a divalent element and a pentavalent element into Al, and thus a description thereof is omitted. As described in the first embodiment, the multiple sputtering technique that sputters an Al target, a divalent element target, and a pentavalent element target simultaneously may be used.

A description will now be given of a simulation conducted to investigate an effective electromechanical coupling coefficient $k_{eff}^2$ of an FBAR of the second embodiment. The simulation uses calculated values by the first principle calculation for the piezoelectric constant, the elastic constant, and the permittivity of the piezoelectric film 26 that is an aluminum nitride film containing a divalent element and a pentavalent element. A description will be given of a simulation performed to a fifth FBAR having the following configuration.

The fifth FBAR uses a multilayered metal film including Cr with a film thickness of 100 nm and Ru with a film thickness of 225 nm stacked in this order from the substrate 22 side for the lower electrode 24. The piezoelectric film 26 is an aluminum nitride film having a film thickness of 850 nm and containing Mg as a divalent element and Ta as a pentavalent element. The substitutional concentration of Mg is set to 12.5 atomic %, and the substitutional concentration of Ta is set to 6.25 atomic %. The upper electrode 28 is a multilayered metal film including Ru with a film thickness of 225 nm and Cr with a film thickness of 30 nm stacked in this order from the substrate 22 side. A $SiO_2$ film with a film thickness of 50 nm is located on the upper electrode 28.

Figure 13:
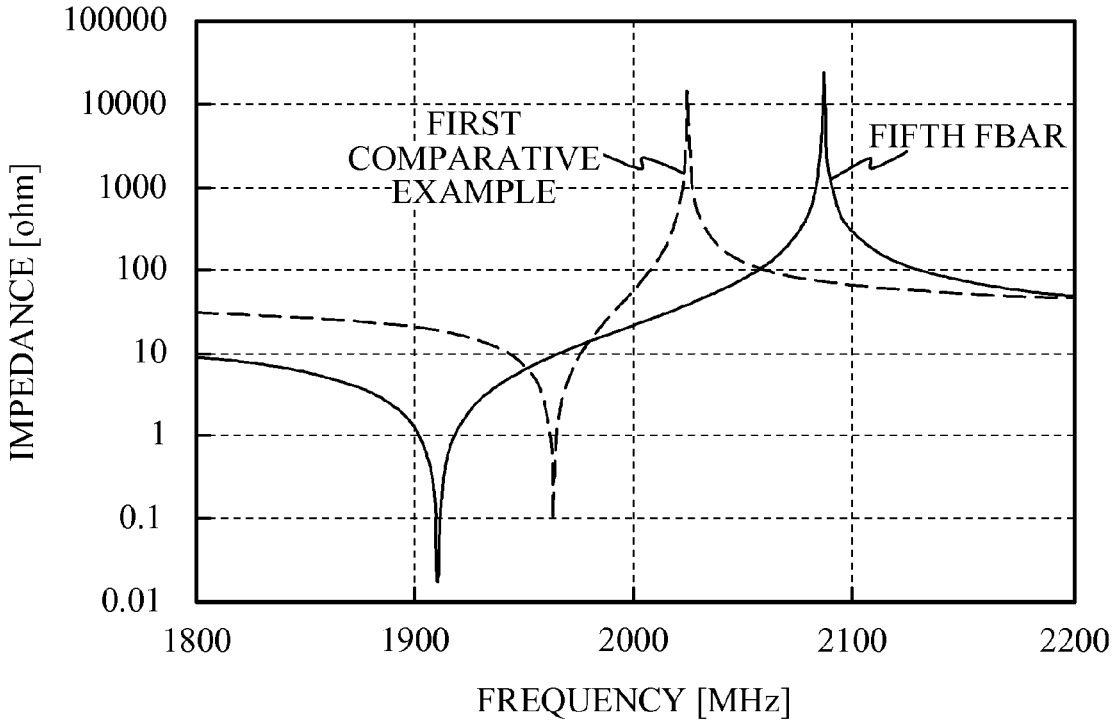
FIG. 13 illustrates simulation results of a resonance characteristic of a fifth FBAR.

FIG. 13 illustrates simulation results of a resonance characteristic of the fifth FBAR. A solid line indicates the resonance characteristic of the fifth FBAR. For comparison, a dashed line indicates the resonance characteristic of the first comparative example described in FIG. 4A and FIG. 4B. As illustrated in FIG. 13, an interval between a resonance frequency and an anti-resonance frequency is wide in the fifth FBAR compared to that in the first comparative example. The effective electromechanical coupling coefficient $k_{eff}^2$ of the first comparative example is 7.22%, whereas the effective electromechanical coupling coefficient $k_{eff}^2$ of the fifth FBAR is 17.6%.

Also simulated are FBARs using various kinds of elements for the divalent element and the pentavalent element contained in the piezoelectric film 26 in the same manner. Table 6 presents simulation results. The substitutional concentration of the divalent element is set to 12.5 atomic %, the substitutional concentration of the pentavalent element is set to 6.25 atomic %, and the configuration other than the kinds of the divalent element and the pentavalent element is the same as that of the fifth FBAR.

TABLE 6

| Combination | Divalent element | Pentavalent element | Resonance frequency [MHz] | Anti-resonance frequency [MHz] | $k_{eff}^2$ [%] |
|---|---|---|---|---|---|
| Case 1 | Mg | Ta | 1910.3 | 2086.1 | 17.6 |
| Case 2 | Mg | Nb | 1977.0 | 2107.6 | 14.3 |
| Case 3 | Mg | V | 1835.5 | 1993.4 | 16.8 |
| Case 4 | Zn | Ta | 1968.3 | 2096.9 | 14.2 |
| Case 5 | Zn | Nb | 1926.9 | 2047.1 | 13.6 |
| Case 6 | Zn | V | 2080.1 | 2179.4 | 10.7 |
| Aluminum nitride | — | — | 1963.0 | 2024.0 | 7.22 |

As presented in Table 6, the acoustic wave devices using an aluminum nitride film containing a divalent element and a pentavalent element for the piezoelectric film (Case 1 through Case 6) have effective electromechanical coupling coefficients $k_{eff}^2$ greater than that of the acoustic wave device using a non-doped aluminum nitride film for the piezoelectric film (Table 6: Aluminum nitride). A combination of the divalent element and the pentavalent element may be Mg—Ta, Mg—Nb, Mg—V, Zn—Ta, Zn—Nb, or Zn—V as presented in Table 6, but may be other combinations.

The second embodiment demonstrates that an acoustic wave device having a high electromechanical coupling coefficient can be also obtained by using an aluminum nitride film containing a divalent element and a pentavalent element for the piezoelectric film 26.

In Table 6, the piezoelectric film 26 contains Mg or Zn as the divalent element, but may contain both of them. In addition, the piezoelectric film 26 contains one of Ta, Nb, and V as the pentavalent element, but may contain two or more of them. That is to say, the piezoelectric film 26 may contain at least one of Mg and Zn as the divalent element, and contain at least one of Ta, Nb, and V as the pentavalent element. Furthermore, the piezoelectric film 26 may contain a divalent element and a pentavalent element other than those cited in Table 6.

A description will now be given of an insulation property of doped AlN doped with a divalent element and a pentavalent element (hereinafter, referred to as fourth doped AlN). The insulation property is evaluated by calculating an electronic state of the fourth doped AlN by the first principle calculation and drawing a band diagram. For comparison, an insulation property of doped AlN doped with only a pentavalent element (hereinafter, referred to as fifth doped AlN)

is also evaluated in the same manner. The fourth doped AlN and the fifth doped AlN have the following crystal structures.

The fourth doped AlN is doped AlN formed by substituting divalent elements in two of the aluminum atoms 10 and substituting a pentavalent element in another one of the aluminum atoms 10 in the non-doped AlN with the wurtzite-type crystal structure described in FIG. 1. Thus, a ratio of the substitutional concentration of the divalent element to that of the pentavalent element is 2:1. Mg is used as the divalent element, and Ta is used as the pentavalent element.

The fifth doped AlN is doped AlN formed by substituting a pentavalent element in one of the aluminum atoms 10 in the non-doped AlN with the wurtzite-type crystal structure described in FIG. 1. Ta is used as the pentavalent element.

Figure 14:
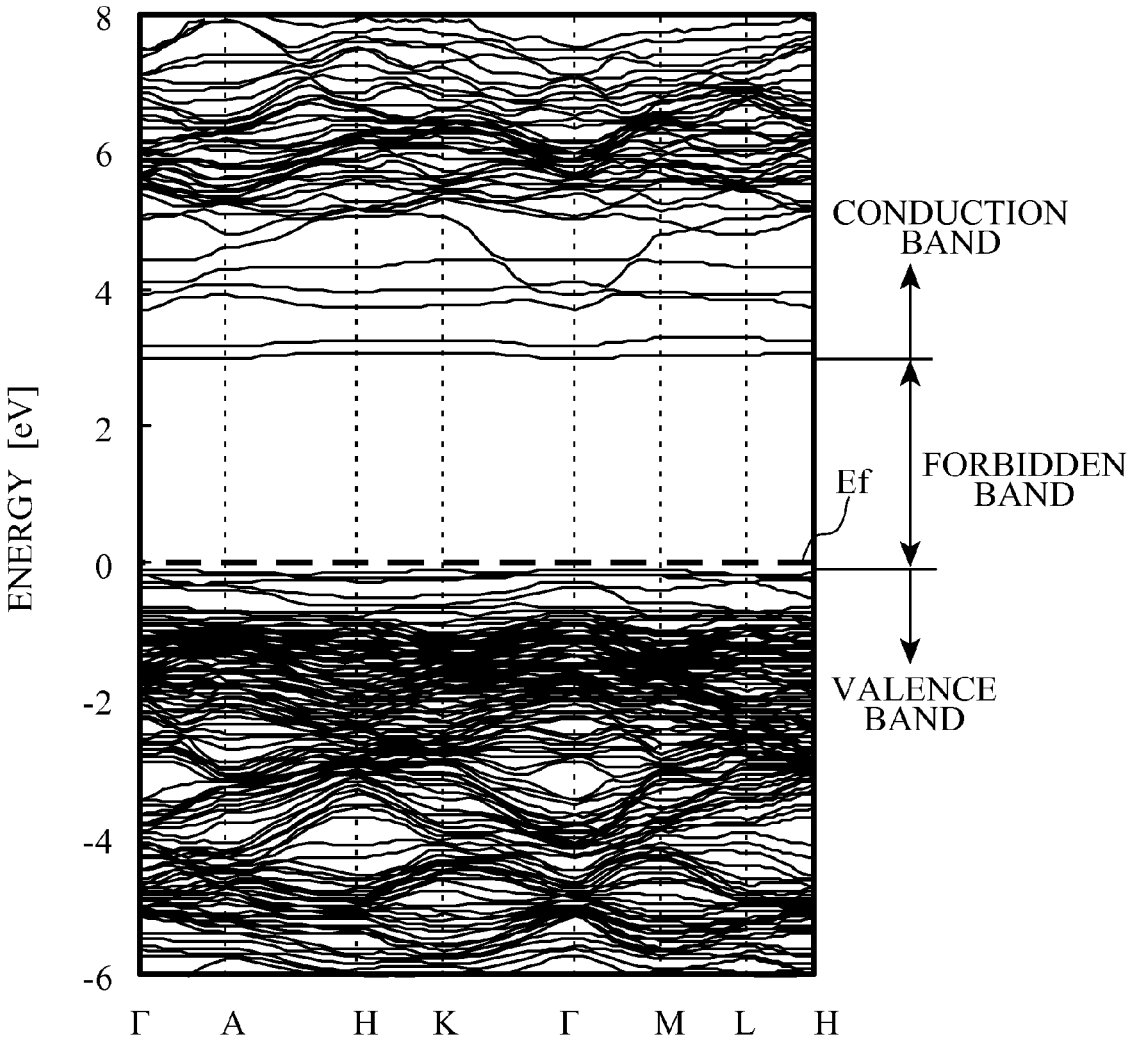
FIG. 14 illustrates simulation results of a band structure of fourth doped aluminum nitride.
Figure 15:
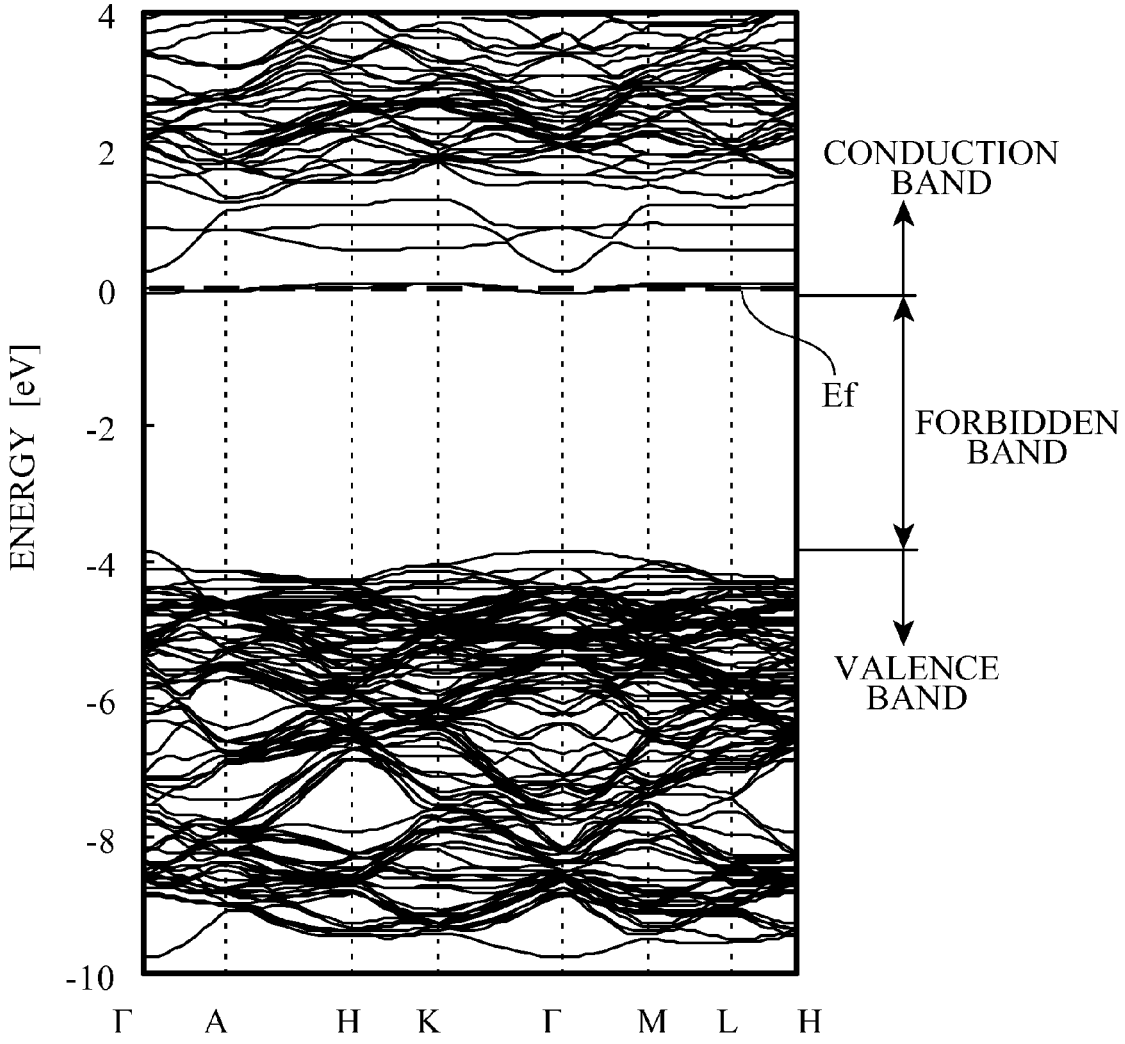
FIG. 15 illustrates simulation results of a band structure of fifth doped aluminum nitride.

FIG. 14 illustrates simulation results of a band structure of the fourth doped AlN. FIG. 15 illustrates simulation results of a band structure of the fifth doped AlN. As described for FIG. 6, the Fermi energy Ef lies in the valence band and the insulation property degrades when AlN is doped with only Mg as a divalent element. As illustrated in FIG. 15, when AlN is doped with only Ta as a pentavalent element, the Fermi energy Ef is located above the bottom of the conduction band, and thus lies in the conduction band. This reveals that the insulation property also degrades when AlN is doped with only a pentavalent element.

On the other hand, when AlN is doped with Mg as a divalent element and Ta as a pentavalent element at a ratio of 2:1, the Fermi energy Ef lies in the forbidden band between the top of the valence band and the bottom of the conduction band as illustrated in FIG. 14. This reveals that the insulation property can be maintained by doping AlN with a divalent element and a pentavalent element, and making a ratio of substitutional concentrations of the divalent element to the pentavalent element 2:1. This is because an electric property of the doped AlN can remain neutral by making a ratio of substitutional concentrations of the divalent element to the pentavalent element 2:1 because both the divalent element and the pentavalent element are substituted in trivalent aluminum sites as described in the first embodiment. FIG. 14 illustrates a case where Mg is used as the divalent element and Ta is used as the pentavalent element, but the insulation property can be maintained even when other divalent elements and pentavalent elements are used.

Therefore, an acoustic wave device that maintains the insulation property of the piezoelectric film 26 and has a high electromechanical coupling coefficient can be obtained by using an aluminum nitride film containing a divalent element and a pentavalent element at a ratio of 2:1 for the piezoelectric film 26 in the FBAR of the second embodiment. A ratio of substitutional concentrations of the divalent element to the pentavalent element is preferably 2:1 to the extent that the electric property of the piezoelectric film can remain neutral.

Figure 16:
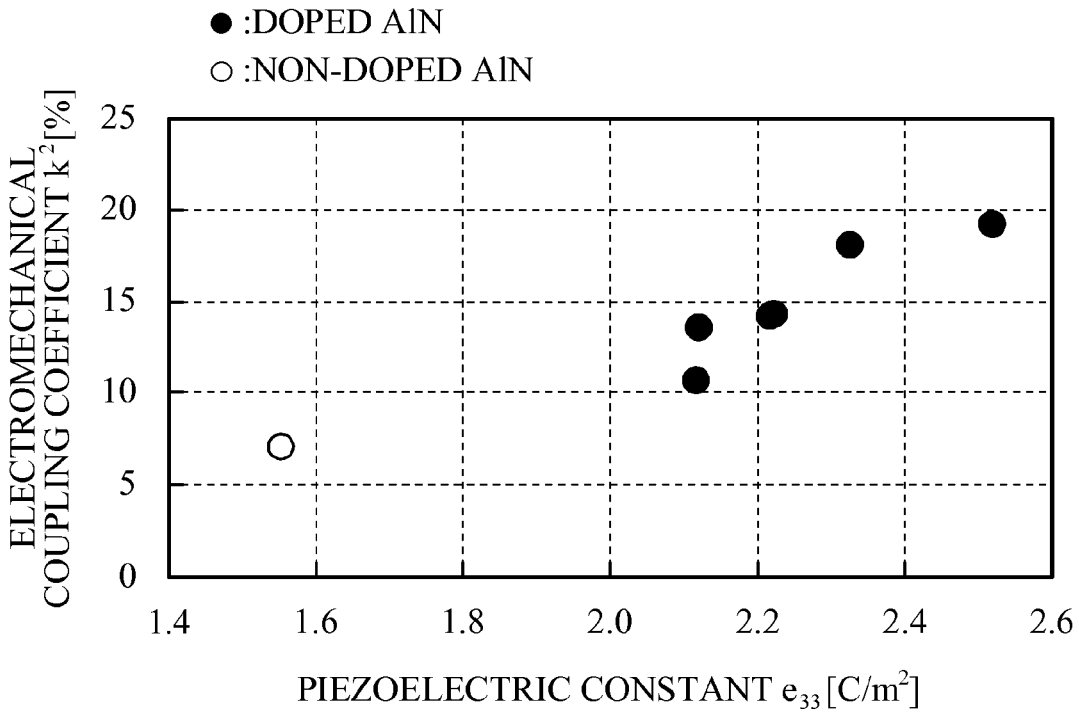
FIG. 16 illustrates a relationship between a piezoelectric constant $e_{33}$ and an electromechanical coupling coefficient $k^2$.

A description will be given of a relationship between a piezoelectric constant $e_{33}$ and a $k^2$ of doped AlN doped with a divalent element and a pentavalent element. The piezoelectric constant $e_{33}$ and the $k^2$ of the doped AlN are calculated in the same way as that described in FIG. 8 of the first embodiment. FIG. 16 illustrates a relationship between piezoelectric constants $e_{33}$ and $k^2$ with respect to the doped AlN of Case 1 through Case 6 presented in Table 5 and the non-doped AlN. In FIG. 16, the open circle indicates a result of the non-doped AlN, and black circles indicate results of the doped AlN. As illustrated in FIG. 16, all doped AlN doped with a divalent element and a pentavalent element have piezoelectric constants $e_{33}$ greater than that of the non-doped AlN, and the electromechanical coupling coefficient $k^2$ increases as the piezoelectric constant $e_{33}$ increases. This reveals that the FBAR of the second embodiment preferably uses an aluminum nitride film containing a divalent element and a pentavalent element and having a piezoelectric constant $e_{33}$ greater than 1.55, which is the piezoelectric constant $e_{33}$ of aluminum nitride, for the piezoelectric film 26 in. The above-described configuration allows the piezoelectric film 26 to have a high electromechanical coupling coefficient, and accordingly allows an acoustic wave device having a high electromechanical coupling coefficient to be obtained.

As illustrated in FIG. 16, the piezoelectric constant $e_{33}$ of the piezoelectric film 26 is preferably greater than 1.6, more preferably 1.8 because the electromechanical coupling coefficient $k^2$ increases as the piezoelectric constant $e_{33}$ increases.

Figure 17:
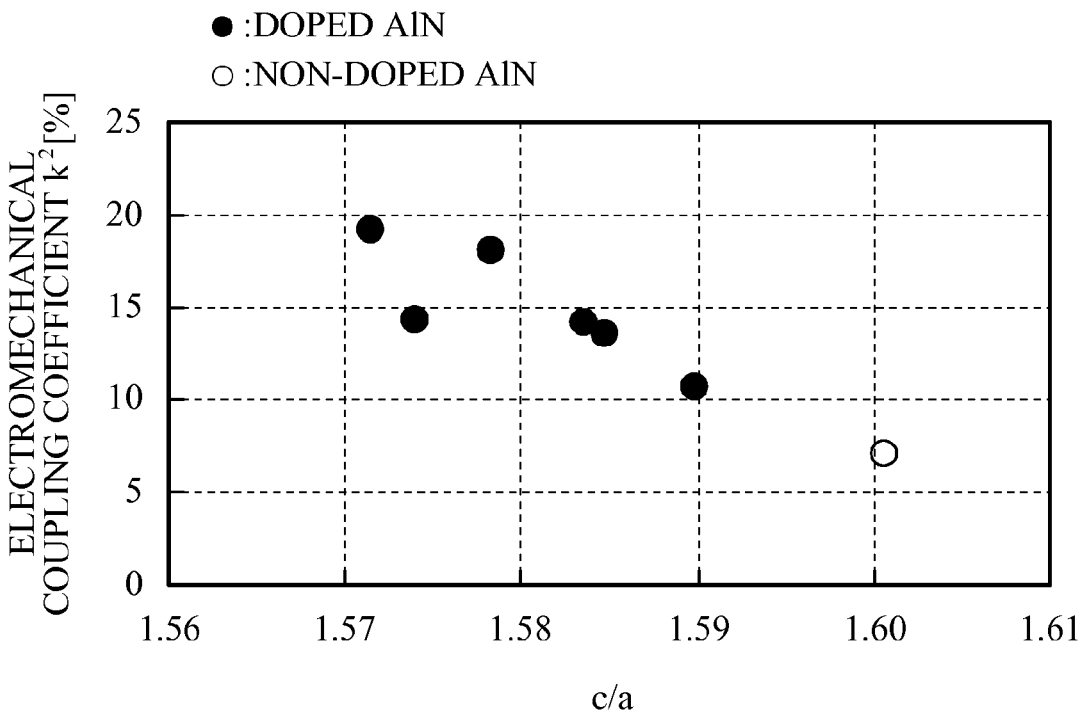
FIG. 17 illustrates a relationship between a ratio (c/a) of a lattice constant in a c-axis direction to a lattice constant in an a-axis direction and an electromechanical coupling coefficient $k^2$.

A description will now be given of a relationship between a crystal structure and an electromechanical coupling coefficient $k^2$ of doped AlN doped with a divalent element and a pentavalent element. The crystal structure of the doped AlN is evaluated with a c/a ratio as described in FIG. 9 of the first embodiment. The electromechanical coupling coefficient $k^2$ is calculated in the same way as that described in FIG. 9 of the first embodiment. FIG. 17 illustrates a relationship between a c/a ratio and an electromechanical coupling coefficient $k^2$ with respect to the doped AlN of Case 1 through Case 6 presented in Table 5 and the non-doped AlN. In FIG. 17, the open circle indicate a result of the non-doped AlN, and black circles indicate results of the doped AlN. As illustrated in FIG. 17, all doped AlN doped with a divalent element and a pentavalent element have c/a ratios less than that of the non-doped AlN, and the electromechanical coupling coefficient $k^2$ increases as the c/a ratio decreases. Therefore, the FBAR of the second embodiment preferably uses an aluminum nitride film containing a divalent element and a pentavalent element and having a c/a ratio less than 1.6, which is the c/a ratio of aluminum nitride, for the piezoelectric film 26. The above-described configuration allows the piezoelectric film 26 to have a high electromechanical coupling coefficient, and thus allows an acoustic wave device having a high electromechanical coupling coefficient to be obtained.

As illustrated in FIG. 17, the piezoelectric film 26 preferably has a c/a ratio less than 1.595, more preferably 1.59 because the electromechanical coupling coefficient $k^2$ increases as the c/a ratio decreases.

A description will be given of a dependence of an electromechanical coupling coefficient $k^2$ on substitutional concentrations of doped AlN doped with a divalent element and a pentavalent element. The dependence of the electromechanical coupling coefficient $k^2$ on substitutional concentrations is evaluated in the same way as that described in FIG. 10A and FIG. 10B of the first embodiment. The ratio of substitutional concentrations of the divalent element to the pentavalent element is set to 2:1 so that the electric property of the doped AlN is neutral.

Figure 18:
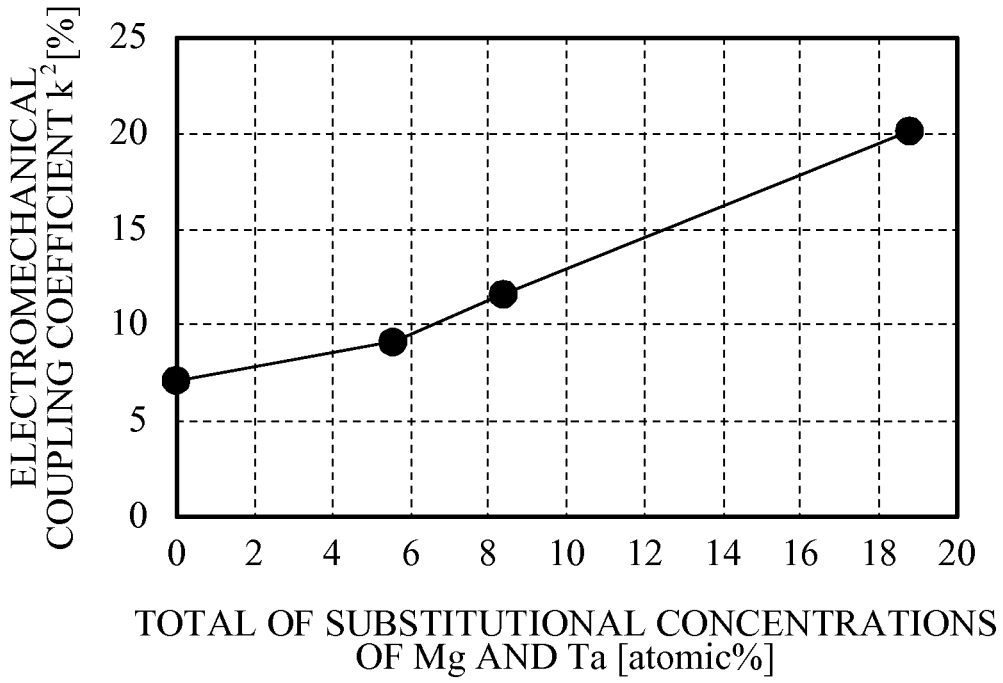
FIG. 18 illustrates a dependence of an electromechanical coupling coefficient $k^2$ on substitutional concentrations when magnesium is used as a divalent element and tantalum is used as a pentavalent element.

FIG. 18 illustrates a dependence of an electromechanical coupling coefficient $k^2$ on substitutional concentrations when Mg is used as the divalent element and Ta is used as the pentavalent element. FIG. 18 reveals that the electromechanical coupling coefficient $k^2$ increases as the substitutional concentrations increase. This reveals that the electromechanical coupling coefficient $k^2$ of the doped AlN can be controlled to be a desired value by controlling the substitutional concentrations as is the case with the first embodiment. For example, doped AlN with an electromechanical coupling coefficient $k^2$ of 10% can be obtained by controlling the total of substitutional concentrations of Mg and Ta to be approximately 7 atomic %. The simulation uses Mg as the divalent element and Ta as the pentavalent element, but other divalent elements and pentavalent elements may be used.

Therefore, an acoustic wave device with a desired electromechanical coupling coefficient can be obtained by controlling the substitutional concentrations of the divalent element and the pentavalent element contained in the piezoelectric film 26 in the FBAR of the second embodiment.

A description will now be given of an acoustic wave device in accordance with a first variation of the second embodiment. The acoustic wave device of the first variation of the second embodiment uses an aluminum nitride film containing a divalent element and a pentavalent element for the piezoelectric films 26a and 26b. Other configurations are the same as those of the first variation of the first embodiment, and thus a description thereof is omitted.

A description will be given of a simulation conducted to investigate an effective electromechanical coupling coefficient $k_{eff}^2$ of an FBAR of the first variation of the second embodiment. As is the case with the second embodiment, calculated values by the first principle calculation are used for the piezoelectric constants, the elastic constants, and the permittivities of the piezoelectric films 26a and 26b that are aluminum nitride films containing a divalent element and a pentavalent element. A description will now be given of a simulation performed to a sixth FBAR having the following configuration.

The sixth FBAR uses a multilayered metal film including Cr with a film thickness of 100 nm and Ru with a film thickness of 225 nm stacked in this order from the substrate 22 side for the lower electrode 24. The piezoelectric films 26a and 26b are aluminum nitride films having a film thickness of 375 nm and containing Mg as a divalent element and Ta as a pentavalent element. The substitutional concentration of Mg is set to 12.5 atomic %, and the substitutional concentration of Ta is set to 6.25 atomic %. A $SiO_2$ film with a film thickness of 50 nm is used for the temperature compensation film 42. The upper electrode 28 is a multilayered metal film including Ru with a film thickness of 225 nm and Cr with a film thickness of 30 nm stacked in this order from the substrate 22 side. A $SiO_2$ film with a film thickness of 50 nm is located on the upper electrode 28.

Figure 19:
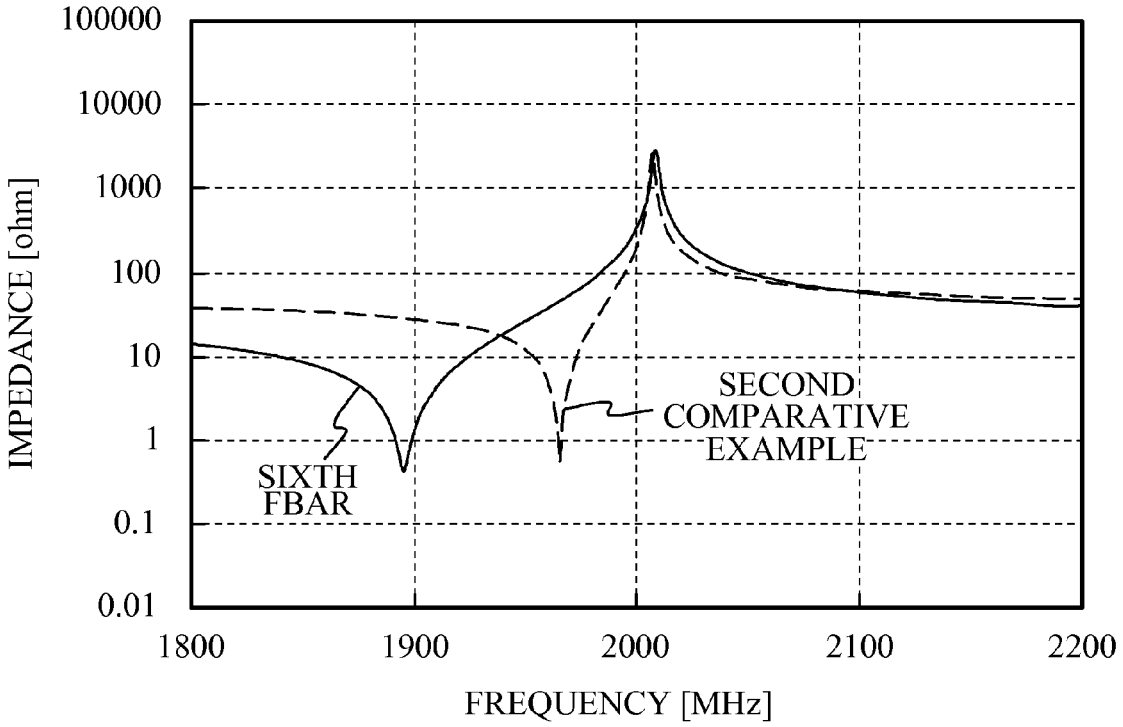
FIG. 19 illustrates simulation results of a resonance characteristic of a sixth FBAR.

FIG. 19 illustrates simulation results of a resonance characteristic of the sixth FBAR. A solid line indicates the resonance characteristic of the sixth FBAR. A dashed line indicates the resonance characteristic of the second comparative example described in FIG. 12 for comparison. As illustrated in FIG. 19, an interval between a resonance frequency and an anti-resonance frequency is wide in the sixth FBAR compared to the second comparative example. The effective electromechanical coupling coefficient $k_{eff}^2$ of the second comparative example is 5.01%, whereas the effective electromechanical coupling coefficient $k_{eff}^2$ of the sixth FBAR is 13.1%.

Also simulated are FBARs using various kinds of elements for the divalent element and the pentavalent element contained in the piezoelectric films 26a and 26b in the same manner. Table 7 presents simulation results. The substitutional concentration of the divalent element is set to 12.5 atomic %, the substitutional concentration of the pentavalent element is set to 6.25 atomic %, and the configuration other than the divalent element and the pentavalent element is the same as that of the sixth FBAR.

TABLE 7

| Combination | Divalent element | Pentavalent element | Resonance frequency [MHz] | Anti-resonance frequency [MHz] | $k_{eff}^2$ [%] |
|---|---|---|---|---|---|
| Case 1 | Mg | Ta | 1895.3 | 2008.2 | 13.1 |
| Case 2 | Mg | Nb | 1941.8 | 2024.8 | 9.69 |
| Case 3 | Mg | V | 1832.8 | 1936.6 | 12.5 |
| Case 4 | Zn | Ta | 1935.0 | 2016.7 | 9.59 |
| Case 5 | Zn | Nb | 1901.3 | 1978.6 | 9.26 |
| Case 6 | Zn | V | 2018.4 | 2078.8 | 6.96 |
| Aluminum nitride | — | — | 1965.3 | 2007.0 | 5.01 |

As presented in Table 7, the acoustic wave devices using an aluminum nitride film containing a divalent element and a pentavalent element for the piezoelectric film (Case 1 through Case 6) have effective electromechanical coupling coefficients $k_{eff}^2$ greater than that of the acoustic wave device using a non-doped aluminum nitride film for the piezoelectric film (Table 7: Aluminum nitride) even when the temperature compensation film 42 is included. A combination of the divalent element and the pentavalent element may be Mg—Ta, Mg—Nb, Mg—V, Zn—Ta, Zn—Nb, or Zn—V as presented in Table 7, but may be other combinations.

The first variation of the second embodiment demonstrates that an acoustic wave device having a high electromechanical coupling coefficient can be obtained by using an aluminum nitride film containing a divalent element and a pentavalent element for the piezoelectric films 26a and 26b even when the temperature compensation film 42 is included.

The first variation of the first embodiment and the first variation of the second embodiment insert the temperature compensation film 42 between the piezoelectric films 26a and 26b, but the temperature compensation film 42 may be located in other locations as long as it contacts the piezoelectric film. For example, the temperature compensation film 42 may be located between the upper electrode 28 and the piezoelectric film 26b, or between the lower electrode 24 and the piezoelectric film 26a.

Third Embodiment

A third embodiment describes an experiment performed to an aluminum nitride film formed so as to contain a divalent element and a tetravalent element. The aluminum nitride film containing a divalent element and a tetravalent element is formed as follows. Doped AlN films with different concentrations of Mg and Zr are formed by sputtering an Al target, a Mg target, and a Zr target simultaneously in a mixed gas atmosphere of Ar and $N_2$ with varying electrical power applied to each target.

Figure 20A:
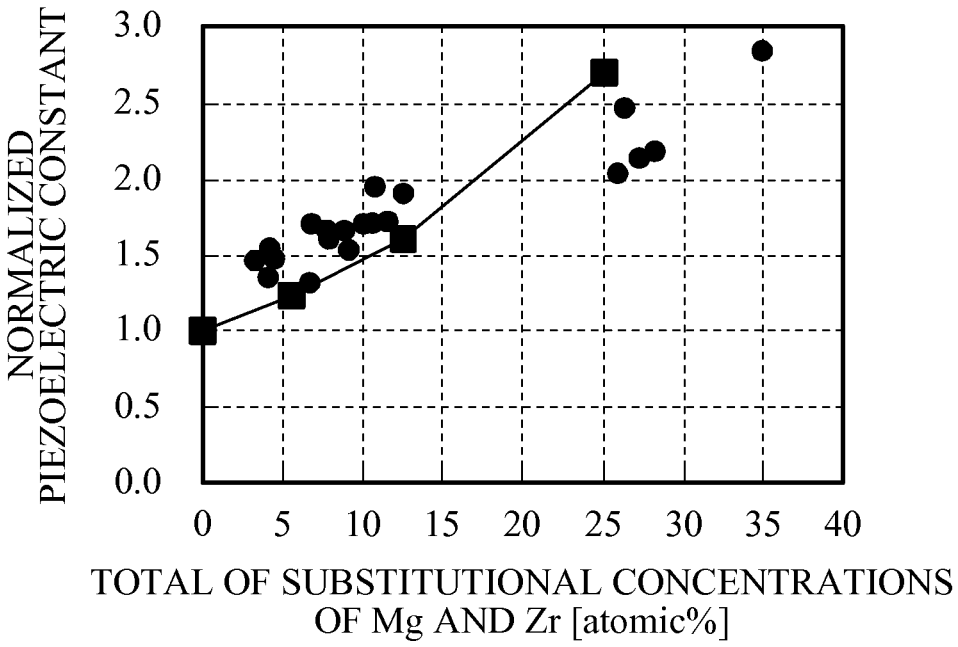
FIG. 20A illustrates a relationship between a total of substitutional concentrations of Mg and Zr and a normalized piezoelectric constant.
Figure 20B:
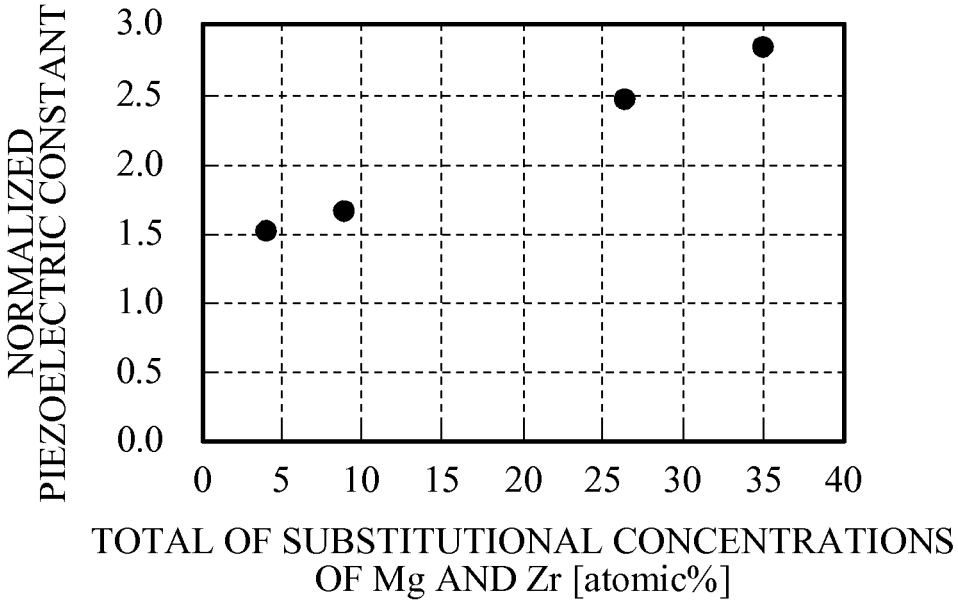
FIG. 20B is a diagram that extracts data of which a ratio of substitutional concentrations of Mg to Zr is around 1:1 from FIG. 20A.

A description will be given of measurement results of piezoelectric constants of the fabricated doped AlN films. A piezoelectric constant is measured with a piezometer under a condition that a load is 0.25N and a frequency is 110 Hz. FIG. 20A illustrates a relationship between a total of substitutional concentrations of Mg and Zr and a normalized piezoelectric constant, and FIG. 20B is a diagram that extracts data of which a ratio of substitutional concentrations of Mg to Zr is around 1:1 from FIG. 20A. In FIG. 20A and FIG. 20B, the normalized piezoelectric constant (vertical axis) is a piezoelectric constant normalized by the piezoelectric constant of the non-doped AlN. Circles indicate measurement results of the fabricated doped AlN films. Rectangles indicate calculation results of the first principle calculation as a reference.

As illustrated in FIG. 20A and FIG. 20B, the doped AlN films containing Mg and Zr have piezoelectric constants greater than that of the non-doped AlN when they have a total of substitutional concentrations of Mg and Zr greater than or equal to 3 atomic % and less than or equal to 35 atomic %. In addition, not only when the ratio of substitutional concentrations of Mg to Zr is around 1:1, but also when it is shifted from 1:1, the piezoelectric constant is high as long as the total of substitutional concentrations of Mg and Zr is greater than or equal to 3 atomic % and less than or equal to 35 atomic %.

Figure 21A:
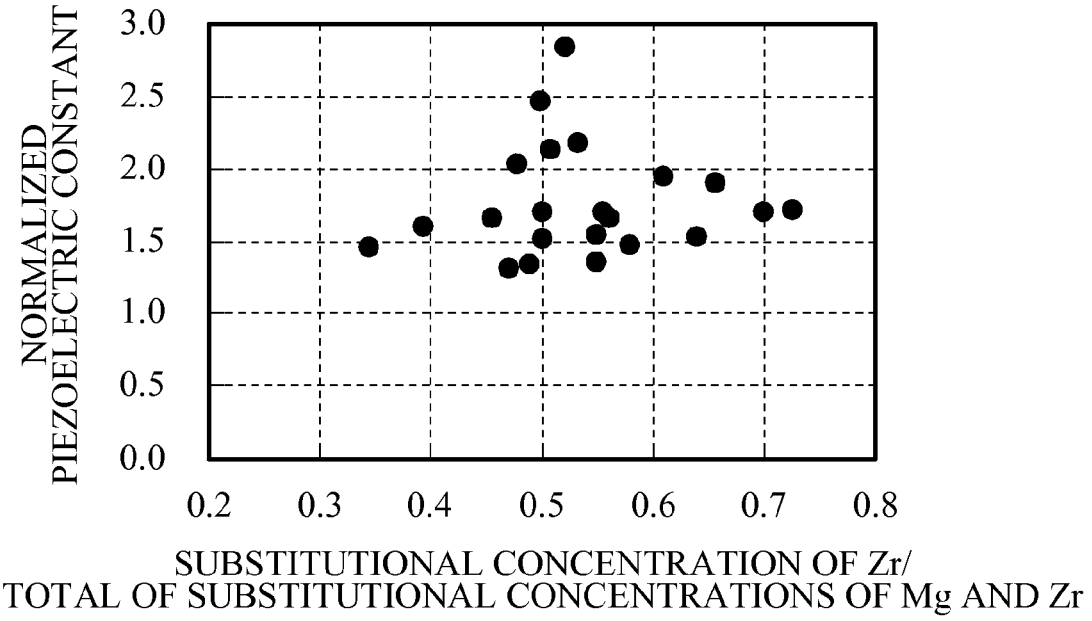
FIG. 21A illustrates a relationship between a ratio of a substitutional concentration of Zr to a total of substitutional concentrations of Mg and Zr and a normalized piezoelectric constant.
Figure 21B:
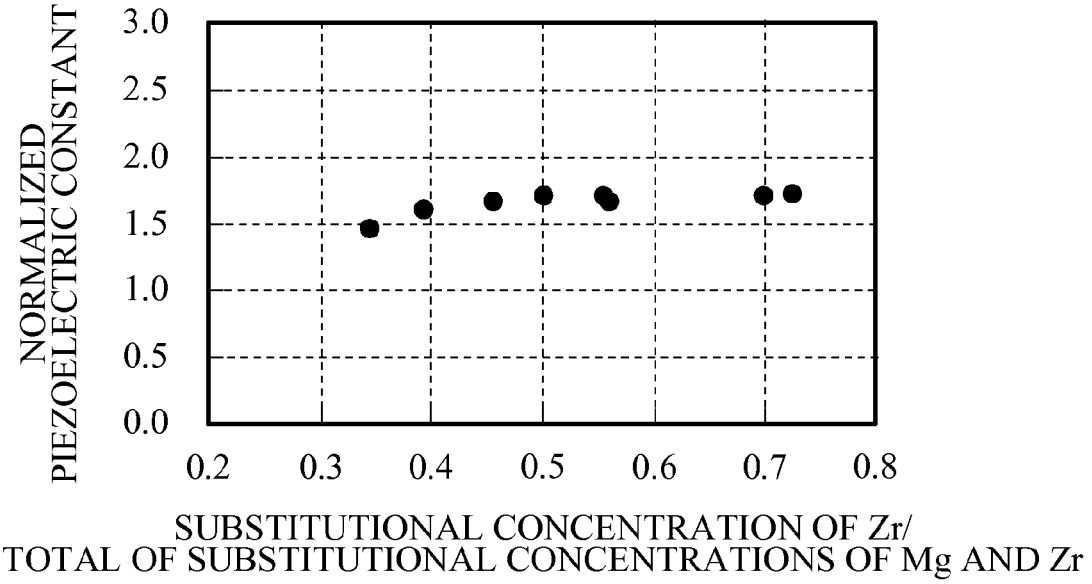
FIG. 21B is a diagram that extracts data of which a total of substitutional concentrations of Mg and Zr is greater than or equal to 3 atomic % and less than or equal to 10 atomic % from FIG. 21A.

FIG. 21A illustrates a relationship between a ratio of a substitutional concentration of Zr to a total of substitutional concentrations of Mg and Zr and a normalized piezoelectric constant, and FIG. 21B is a diagram that extracts data of which a total of substitutional concentrations of Mg and Zr is greater than or equal to 3 atomic % and less than or equal to 10 atomic % from FIG. 21A. In FIG. 21A and FIG. 21B, the normalized piezoelectric constant (vertical axis) is a piezoelectric constant normalized by the piezoelectric constant of the non-doped AlN. A horizontal axis represents a ratio of a substitutional concentration of Zr to a total of substitutional concentrations of Mg and Zr (substitutional concentration of Zr/(total of substitutional concentrations of Mg and Zr)).

As illustrated in FIG. 21A and FIG. 21B, the doped AlN films containing Mg and Zr have piezoelectric constants greater than that of the non-doped AlN when they have a ratio of a substitutional concentration of Zr to a total of substitutional concentrations of Mg and Zr greater than or equal to 0.35 and less than or equal to 0.75. In addition, when the total of substitutional concentrations of Mg and Zr is greater than or equal to 3 atomic % and less than or equal to 10 atomic %, the piezoelectric constant is almost constant as long as the ratio of a substitutional concentration of Zr to a total of substitutional concentrations of Mg and Zr is greater than or equal to 0.35 and less than or equal to 0.75.

Figure 22A:
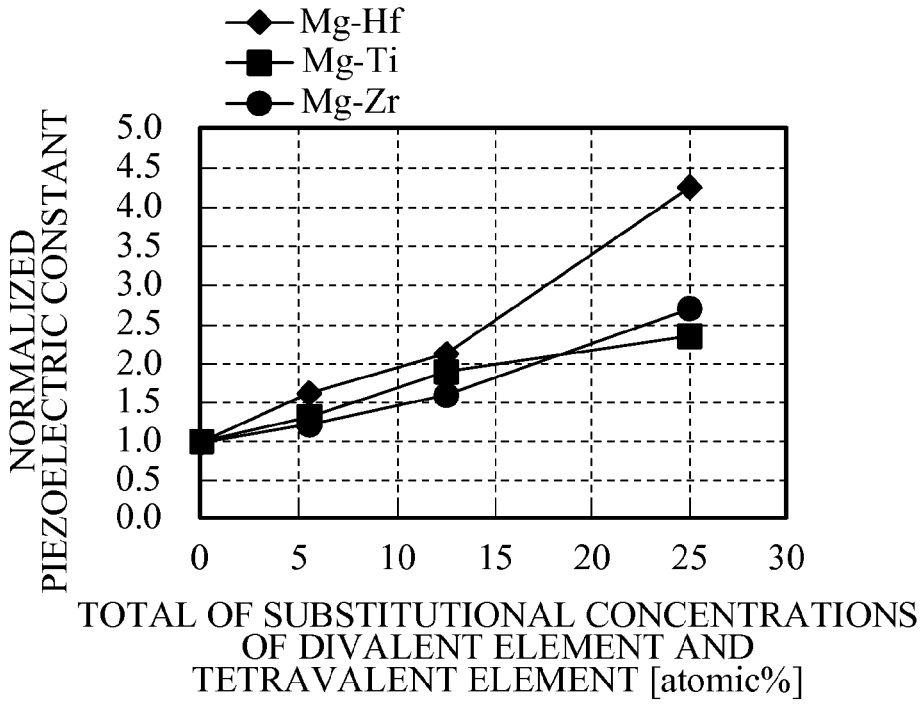
FIG. 22A and FIG. 22B illustrate relationships between a total of substitutional concentrations of a divalent element and a tetravalent element and a normalized piezoelectric constant.
Figure 22B:
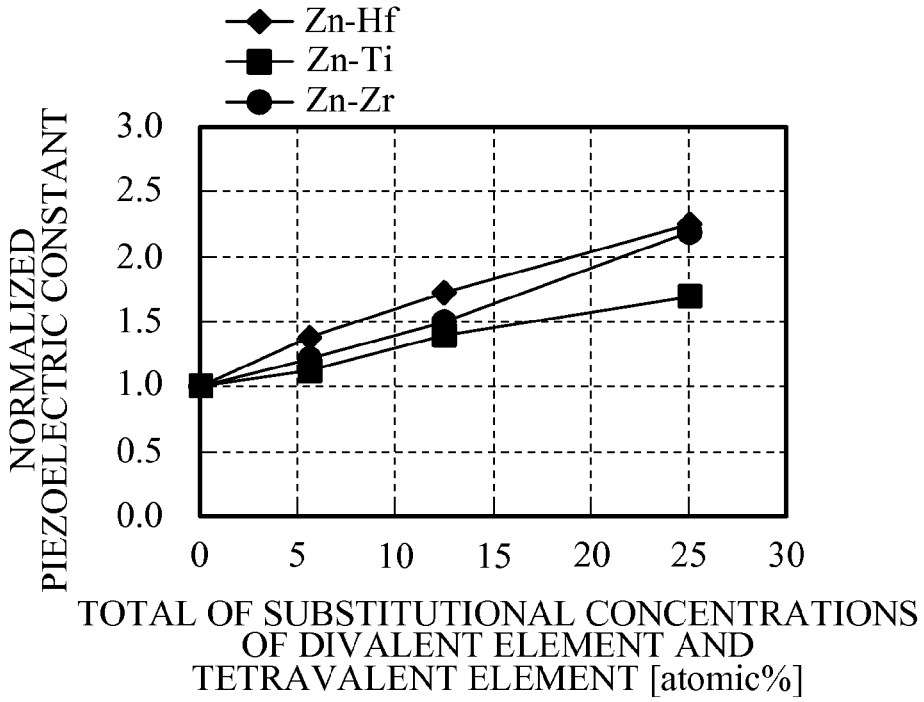

Here, a description will be given of a dependence of a piezoelectric constant on substitutional concentrations of doped AlN doped with Mg or Zn as a divalent element and Hf, Ti, or Zr as a tetravalent element. The dependence of the piezoelectric constant on substitutional concentrations is evaluated by calculation by the first principle calculation. FIG. 22A and FIG. 22B illustrate relationships between a total of substitutional concentrations of a divalent element and a tetravalent element and a normalized piezoelectric constant. In FIG. 22A and FIG. 22B, the normalized piezoelectric constant (vertical axis) is a piezoelectric constant normalized by the piezoelectric constant of the non-doped AlN. FIG. 22A illustrates cases where AlN is doped with Mg as a divalent element and Hf, Ti, or Zr as a tetravalent element, and FIG. 22B illustrates cases where AlN is doped with Zn as a divalent element and Hf, Ti, or Zr as a tetravalent element.

As illustrated in FIG. 22A and FIG. 22B, the piezoelectric constant monotonically increases with increase in substitutional concentrations whether Mg or Zn is used as the divalent element and Hf, Ti, or Zr is used as the tetravalent element to dope AlN. This result dictates that the same tendency will be obtained when other elements are used although FIG. 20A through FIG. 21B illustrate measurement results when Mg is used as the divalent element and Zr is used as the tetravalent element.

Therefore, when an aluminum nitride film containing a divalent element and a tetravalent element is used for a piezoelectric film in an acoustic wave device, a total of substitutional concentrations of the divalent element and the tetravalent element is preferably greater than or equal to 3 atomic % and less than or equal to 35 atomic % as illustrated in FIG. 20A and FIG. 20B. The above-described configuration can make the piezoelectric constant of the piezoelectric film large, and thus allows the acoustic wave device to have a high electromechanical coupling coefficient. To make the piezoelectric constant of the piezoelectric film large, the total of substitutional concentrations of the divalent element and the tetravalent element is preferably greater than or equal to 5 atomic % and less than or equal to 35 atomic %, and more preferably greater than or equal to 10 atomic % and less than or equal to 35 atomic %.

As illustrated in FIG. 21A and FIG. 21B, the ratio of the substitutional concentration of the tetravalent element to the total of substitutional concentrations of the divalent element and the tetravalent element is preferably greater than or equal to 0.35 and less than or equal to 0.75. The above configuration can make the piezoelectric constant of the piezoelectric film large, and allows the acoustic wave device to have a high electromechanical coupling coefficient. To maintain the insulation property of the piezoelectric film, the ratio of the substitutional concentration of the tetravalent element to the total of substitutional concentrations of the divalent element and the tetravalent element is preferably greater than or equal to 0.4 and less than or equal to 0.6, and more preferably greater than or equal to 0.45 and less than or equal to 0.55, and further preferably equal to 0.5.

Figure 23:
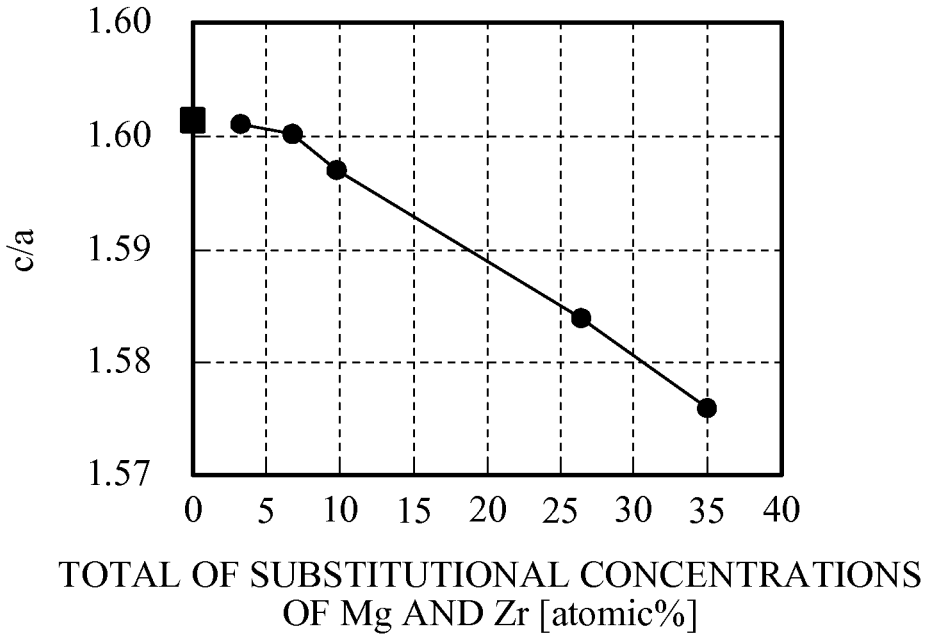
FIG. 23 illustrates a relationship between a total of substitutional concentrations of Mg and Zr and a c/a ratio.

A description will now be given of measurement results of a ratio (c/a) of a lattice constant in the c-axis direction to a lattice constant in the a-axis direction in the fabricated doped AlN films. FIG. 23 illustrates a relationship between a total of substitutional concentrations of Mg and Zr and a c/a ratio. Circles indicate measurement results of the fabricated doped AlN films. For comparison, a rectangle indicates a calculation result of c/a of non-doped AlN by the first principle calculation. FIG. 23 demonstrates that the doped AlN films containing Mg and Zr have c/a ratios less than that of the non-doped AlN when they have a total of substitutional concentrations of Mg and Zr greater than or equal to 3 atomic % and less than or equal to 35 atomic %.

Thus, the total of substitutional concentrations of the divalent element and the tetravalent element is preferably greater than or equal to 3 atomic % and less than or equal to 35 atomic % to make the c/a ratio of the piezoelectric film small and the electromechanical coupling coefficient of the acoustic wave device high.

Fourth Embodiment

A fourth embodiment first describes a relationship between a resonance frequency and a size of a resonance portion of an acoustic wave device. For example, an acoustic wave device with an impedance of 50Ω has a relationship between a resonance frequency fr and a capacitance C expressed with $fr=1/(2\pi\times C\times 50)$. As described above, the capacitance increases as the resonance frequency becomes lower in the acoustic wave device. The capacitance is proportional to an area of the resonance portion, and accordingly the resonance portion becomes larger as the resonance frequency becomes lower. In addition, a frequency f and a wavelength λ of an acoustic wave have a relationship of $f=V/\lambda$. V represents the acoustic velocity of the acoustic wave. The wavelength λ is equal to a period of a comb-shaped electrode when a surface acoustic wave is used, and is equal to the double of total film thickness of a multilayered film of the resonance portion when a bulk acoustic wave is used. The acoustic velocity V of the acoustic wave depends on a material to be used, and accordingly, the wavelength becomes longer and the resonance portion becomes larger as the resonance frequency becomes lower.

A description will now be given of a simulation conducted to investigate a relationship between a resonance frequency and a size of a resonance portion in an acoustic wave device. The simulation is performed to an FBAR of a third comparative example that uses a non-doped AlN film for the piezoelectric film 26 in the FBAR having the structure illustrated in FIG. 2A through FIG. 2C of the first embodiment. The non-doped AlN is assumed to have a permittivity $\in_{33}$ of $8.42\times10^{-}{}_{11}$ F/m, and an acoustic velocity V of 11404 m/s. These values are calculated by the first principle calculation. A resonance frequency is 2 GHz when Ru with a thickness of 240 nm is used for the lower electrode 24 and the upper electrode 28 and a non-doped AlN film with a thickness of 1300 nm is used for the piezoelectric film 26 to configure the resonance portion 30. An area of the resonance portion 30 is $2.455\times10^{-8}$ $m^2$ when the FBAR has an impedance of 50Ω. Here, to investigate a relationship between a resonance frequency and a film thickness of the resonance portion, a resonance frequency is varied by changing a total film thickness with keeping a ratio of film thicknesses of the lower electrode 24, the piezoelectric film 26, and the upper electrode 28 the same. In addition, to investigate a relationship between a resonance frequency and an area of the resonance portion, the area of the resonance portion 30 is changed so that the FBAR has an impedance of 50Ω at each resonance frequency.

Figure 24A:
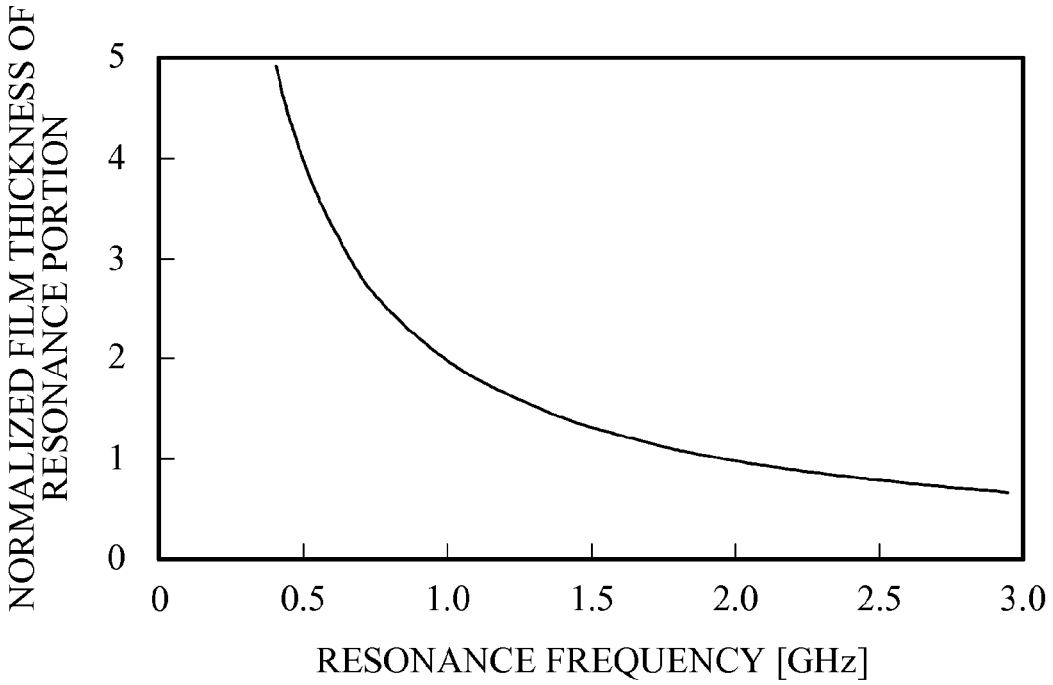
FIG. 24A illustrates a relationship between a resonance frequency and a normalized film thickness of a resonance portion of an FBAR of a third comparative example.
Figure 24B:
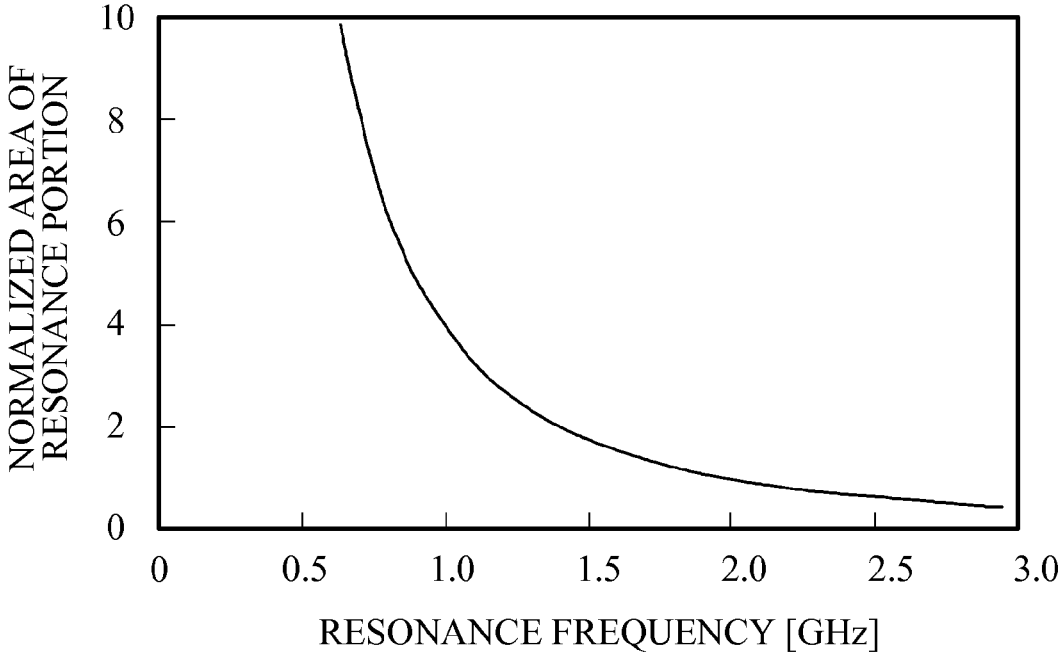
FIG. 24B illustrates a relationship between a resonance frequency and a normalized area of the resonance portion.

FIG. 24A illustrates a relationship between a resonance frequency and a normalized film thickness of a resonance portion of the FBAR of the third comparative example, and FIG. 24B illustrates a relationship between a resonance frequency and a normalized area of the resonance portion. In FIG. 24A and FIG. 24B, the normalized film thickness and the normalized area (vertical axis) are a film thickness and an area normalized by a film thickness and an area when a resonance frequency is 2 GHz, respectively. As illustrated in FIG. 24A and FIG. 24B, a film thickness and area of the resonance portion become larger as the resonance frequency becomes lower. As described above, the acoustic wave device grows in size as the resonance frequency becomes lower. Especially, when the resonance frequency is less than or equal to 1.5 GHz, the acoustic wave device drastically grows in size, and when the resonance frequency is less than or equal to 1.0 GHz, the acoustic wave device further drastically grows in size.

As described above, a capacitance increases as a resonance frequency becomes lower. The capacitance is proportional to an area of the resonance portion of the acoustic wave device, and is also proportional to a permittivity of the piezoelectric film used in the acoustic wave device. Therefore, use of a piezoelectric film with a high permittivity in the acoustic wave device can reduce an area of the resonance portion to obtain a desired capacitance and prevent the acoustic wave device from growing in size. Moreover, the above described relational expression of $f=V/\lambda$ suggests that use of a piezoelectric film with a low acoustic velocity can shorten the wavelength λ to obtain a desired frequency f, and prevent the acoustic wave device from growing in size. Accordingly, a description will now be given of a simulation conducted to obtain a piezoelectric film having a high permittivity and a low acoustic velocity.

The simulation is performed to doped AlN with a crystal structure formed by substituting a trivalent element in one of the aluminum atoms 10 in the non-doped AlN with the wurtzite-type crystal structure illustrated in FIG. 1 of the first embodiment. That is to say, simulated is the doped AlN having the wurtzite-type crystal structure containing fifteen aluminum atoms, one trivalent element, and sixteen nitrogen atoms. The trivalent element has a substitutional concentration of 6.25 atomic %. Scandium (Sc) or yttrium (Y) is used as the trivalent element. In addition, as is the case with the first embodiment, doped AlN doped with a divalent element and a tetravalent element is also simulated. The divalent element and the tetravalent element have substitutional concentrations of 6.25 atomic %. Ca, Mg, Sr, or Zn is used as the divalent element, and Ti, Zr, or Hf is used as the tetravalent element.

Table 8 presents calculated values of permittivities $\in_{33}$ in the c-axis direction and acoustic velocities V of the non-doped AlN and the doped AlN. As presented in Table 8, the doped AlN doped with a trivalent element (Case 1 and Case 2) and the doped AlN doped with a divalent element and a tetravalent element (Case 3 through Case 14) have high permittivities $\in_{33}$ and low acoustic velocities V compared to the non-doped AlN (Table 8: Non-doped AlN). The trivalent element, the divalent element, and the tetravalent element are not limited to those presented in Table 8, and may be other elements.

TABLE 8

| Combination | Divalent element | Trivalent element | Tetravalent element | Permittivity $\epsilon_{33}$ [$\times10^{-11}$ F/m] | Acoustic velocity V [m/s] |
|---|---|---|---|---|---|
| Case 1 | — | Sc | — | 8.96 | 10815 |
| Case 2 | — | Y | — | 8.92 | 10914 |
| Case 3 | Ca | — | Ti | 9.58 | 10182 |
| Case 4 | Ca | — | Zr | 10.10 | 10026 |
| Case 5 | Ca | — | Hf | 9.98 | 10108 |
| Case 6 | Mg | — | Ti | 9.71 | 10357 |
| Case 7 | Mg | — | Zr | 9.77 | 10283 |
| Case 8 | Mg | — | Hf | 9.79 | 10358 |
| Case 9 | Sr | — | Ti | 10.10 | 10315 |
| Case 10 | Sr | — | Zr | 10.70 | 10089 |
| Case 11 | Sr | — | Hf | 10.20 | 10108 |
| Case 12 | Zn | — | Ti | 9.82 | 10393 |
| Case 13 | Zn | — | Zr | 9.78 | 10090 |
| Case 14 | Zn | — | Hf | 9.85 | 10269 |
| Non-doped AlN | — | — | — | 8.42 | 11404 |

Figure 25A:
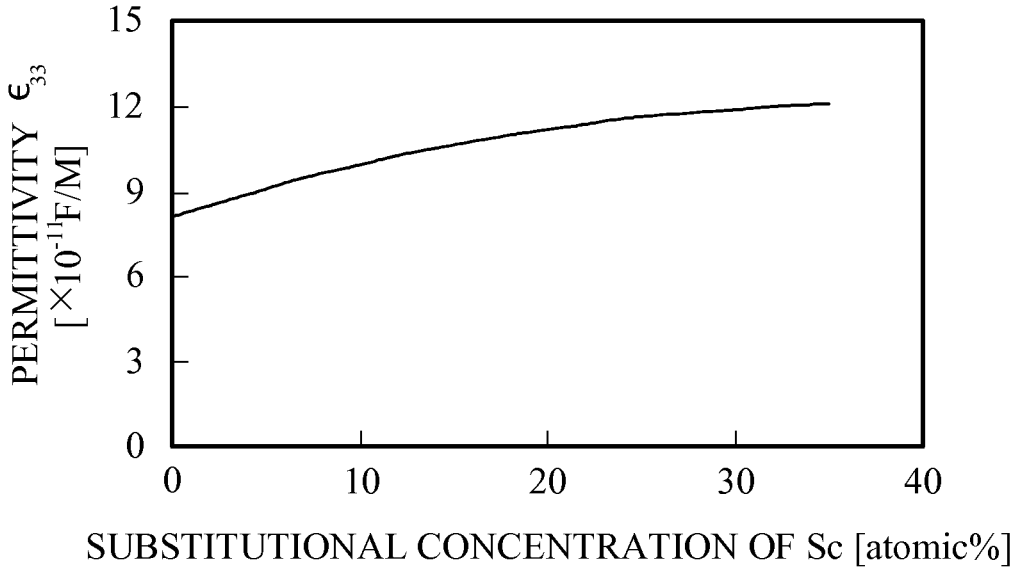
FIG. 25A illustrates a relationship between a substitutional concentration of Sc and a permittivity $\in_{33}$.
Figure 25B:
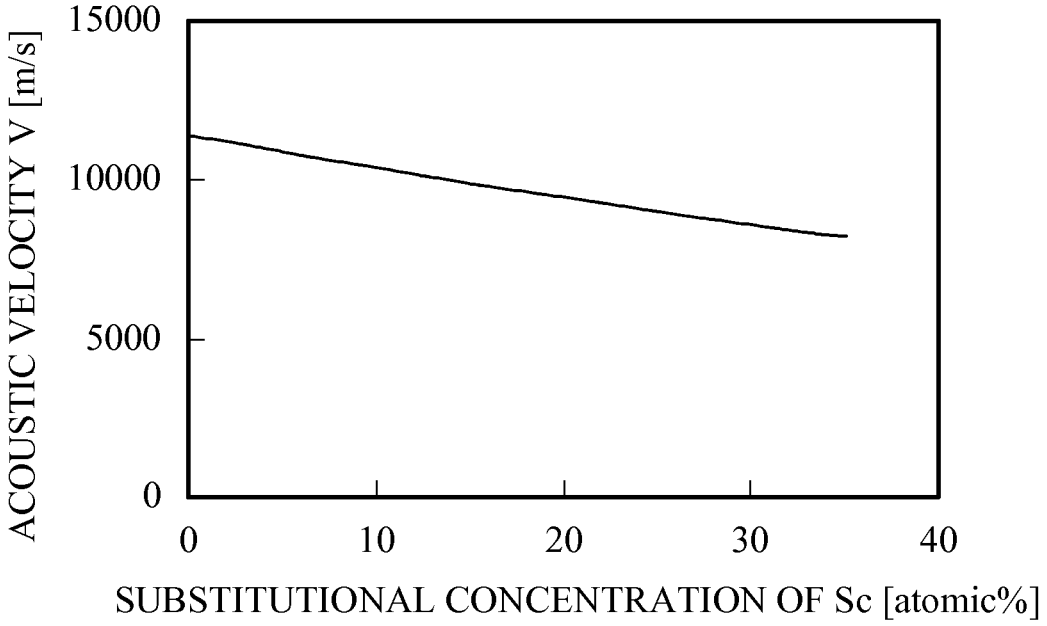
FIG. 25B illustrates a relationship between a substitutional concentration of Sc and an acoustic velocity V.

As presented previously, the inventors have found that the doped AlN containing a trivalent element and the doped AlN containing a divalent element and a tetravalent element have high permittivities $\in_{33}$ and low acoustic velocities V compared to the non-doped AlN. Here, a description will be given of dependences of a permittivity $\in_{33}$ and an acoustic velocity V on a substitutional concentration of doped AlN doped with a trivalent element. The dependences of the permittivity $\in_{33}$ and the acoustic velocity V on the substitutional concentration are evaluated by calculation by the first principle calculation using Sc as the trivalent element. FIG. 25A illustrates a relationship between a substitutional concentration of Sc and a permittivity $\in_{33}$, and FIG. 25B illustrates a relationship between a substitutional concentration of Sc and an acoustic velocity V. FIG. 25A and FIG. 25B demonstrate that the permittivity $\in_{33}$ increases and the acoustic velocity V decreases with increase in the substitutional concentration of Sc. The result having the same tendency is obtained not only when AlN is doped with Sc, but also when it is doped with the trivalent element, or the divalent element and the tetravalent element presented in Table 8. As described above, the concentration of the element with which AlN is doped can change the permittivity $\in_{33}$ and the acoustic velocity V of the doped AlN. Thus, based on the above described knowledge, a description will be given of an acoustic wave device that is prevented from growing in size even when the resonance frequency is less than or equal to 1.5 GHz.

An acoustic wave device of the fourth embodiment has the same configuration as that illustrated in FIG. 2A through FIG. 2C of the first embodiment except that the piezoelectric film 26 is an aluminum nitride film containing a trivalent element, and thus a description thereof is omitted. The piezoelectric film 26 has a crystal structure with a c-axis orientation.

A description will be given of a simulation conducted to investigate a relationship between a resonance frequency and a size of a resonance portion of an FBAR of the fourth embodiment. Simulated is an FBAR using Ru for the lower electrode 24 and the upper electrode 28, and an aluminum nitride film containing Sc with a substitutional concentration of 30 atomic % for the piezoelectric film 26. As with the simulation described in FIG. 24A and FIG. 24B, the resonance frequency is varied to investigate the relationship between the resonance frequency and the film thickness of the resonance portion 30 by changing a total film thickness with keeping a ratio of film thicknesses of the lower electrode 24, the piezoelectric film 26, and the upper electrode 28 the same. In addition, the relationship between the resonance frequency and the area of the resonance portion 30 is investigated by varying the area of the resonance portion 30 so that the FBAR has an impedance of 50Ω at each resonance frequency. The doped AlN doped with Sc with a substitutional concentration of 30 atomic % is assumed to have a permittivity $\in_{33}$ of $1.18\times10^{-10}$ F/m and an acoustic velocity V of 8646 m/s. These values are calculated values by the first principle calculation.

Figure 26A:
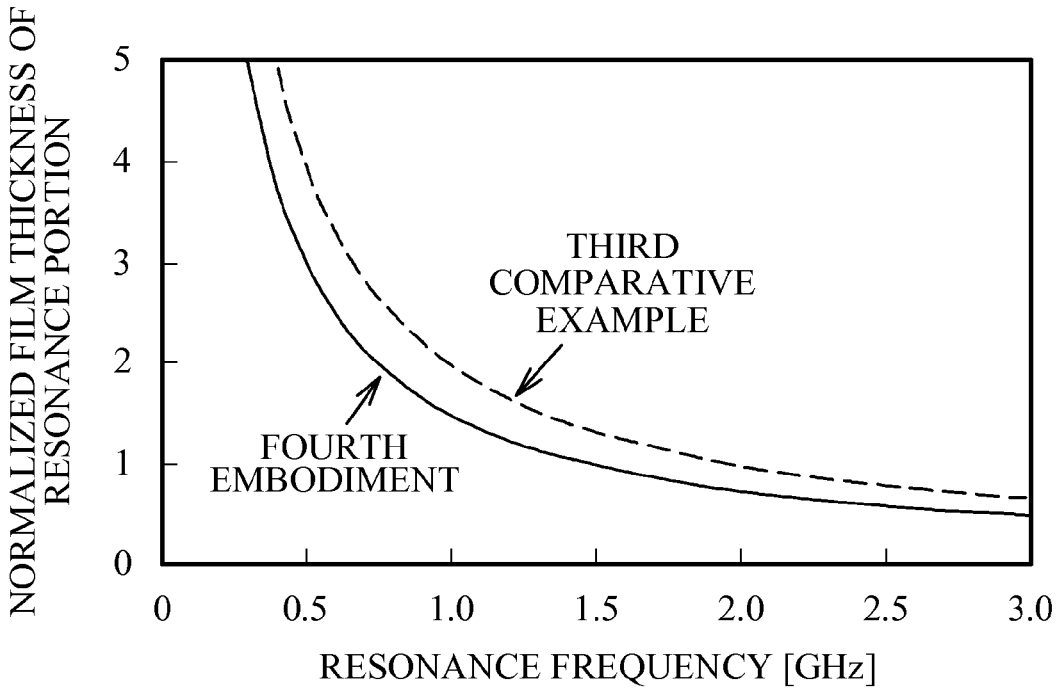
FIG. 26A illustrates a relationship between a resonance frequency and a normalized film thickness of a resonance portion of an FBAR of a fourth embodiment.
Figure 26B:
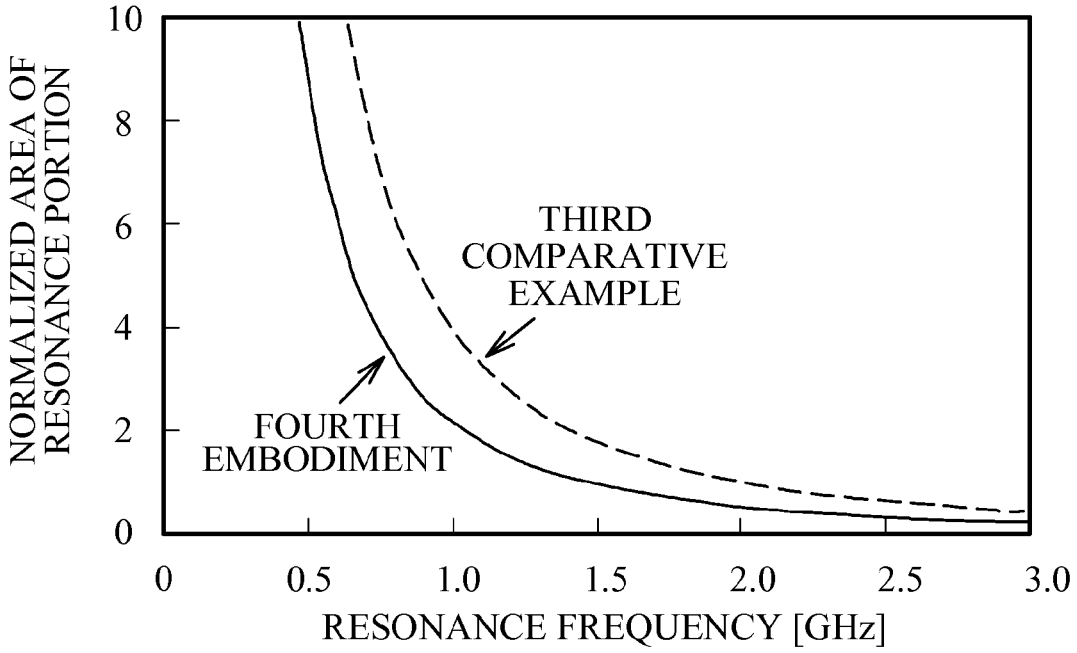
FIG. 26B illustrates a relationship between a resonance frequency and a normalized area of the resonance portion.

FIG. 26A illustrates a relationship between a resonance frequency and a normalized film thickness of a resonance portion of the FBAR of the fourth embodiment, and FIG. 26B illustrates a relationship between a resonance frequency and a normalized area of the resonance portion. Solid lines indicate simulation results of the fourth embodiment, and for comparison, dashed lines indicate simulation results of the third comparative example. In FIG. 26A and FIG. 26B, the normalized film thickness and the normalized area (vertical axis) are a film thickness and an area normalized by a film thickness and an area when a resonance frequency is 2 GHz in the FBAR of the third comparative example, respectively. As illustrated in FIG. 26A and FIG. 26B, at the same resonance frequency, the resonance portion 30 of the fourth embodiment has a smaller film thickness and a smaller area than that of the third comparative example. For example, when the resonance frequency is 700 MHz, the normalized film thickness of the resonance portion is 2.84 in the third comparative example, whereas that of the fourth embodiment is 2.15 and reduced by approximately 24%. The normalized area of the resonance portion is 8.07 in the third comparative example, whereas that of the fourth embodiment is 4.40 and reduced by about 45%.

The fourth embodiment uses an aluminum nitride film containing a trivalent element that increases a permittivity $\in_{33}$ and decreases an acoustic velocity V for the piezoelectric film 26. This configuration allows the resonance portion to have a small film thickness and a small area as illustrated in FIG. 26A and FIG. 26B, and can prevent the acoustic wave device from growing in size even when the acoustic wave device has a resonance frequency less than or equal to 1.5 GHz.

As presented in Table 8, the permittivity $\in_{33}$ increases and the acoustic velocity V decreases when AlN is doped with a divalent element and a tetravalent element. Therefore, an aluminum nitride film containing a divalent element and a tetravalent element may be used for the piezoelectric film 26. When an aluminum nitride film containing the trivalent element presented in Table 8 is used for the piezoelectric film 26, at least one of Sc and Y may be contained. When an aluminum nitride film containing the divalent element and the tetravalent element presented in Table 8 is used, at least one of Ca, Mg, Sr, and Zn may be contained as the divalent element, and at least one of Ti, Zr, and Hf may be contained as the tetravalent element.

The acoustic wave device can be prevented from growing in size by achieving at least one of an increase in the permittivity $\in_{33}$ and a decrease in the acoustic velocity V in the piezoelectric film 26. Therefore, the piezoelectric film 26 is not limited to an aluminum nitride film containing a trivalent element, or a divalent element and a tetravalent element, and may be an aluminum nitride film containing an element that can achieve at least one of an increase in a permittivity $\in_{33}$ and a decrease in an acoustic velocity V. Moreover, when a trivalent element, or a divalent element and a tetravalent element are contained, elements other than the elements presented in Table 8 may be contained.

When the resonance frequency is less than or equal to 1.5 GHz, the acoustic wave device drastically grows in size, and when the resonance frequency is less than or equal to 1.0 GHz, the acoustic wave device further drastically grows in size. This fact leads a conclusion that an aluminum nitride film containing an element that contributes to at least one of an increase in the permittivity $\in_{33}$ and a decrease in the acoustic velocity V is preferably used for the piezoelectric film 26 of the acoustic wave device with a resonance frequency less than or equal to 1.0 GHz.

To prevent the acoustic wave device from growing in size, the permittivity $\in_{33}$ of the piezoelectric film 26 is preferably greater than $8.42\times10^{-11}$ F/m, which is the permittivity of the non-doped AlN. The acoustic velocity V is preferably less than 11404 m/s, which is the acoustic velocity of the non-doped AlN.

Figure 27A:
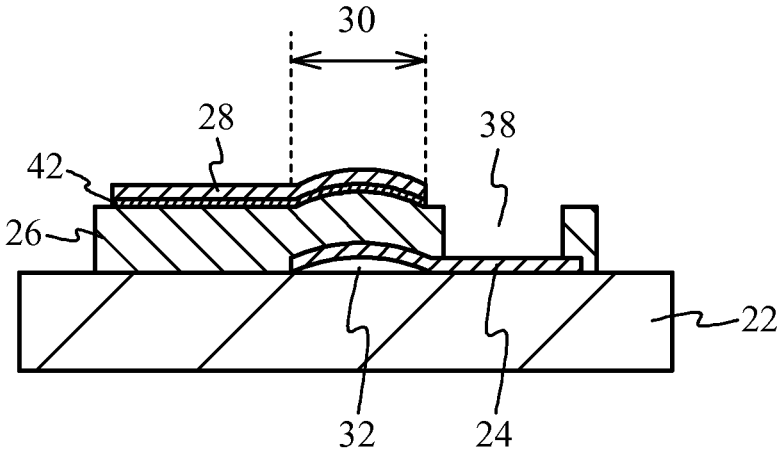
FIG. 27A is a cross-sectional view of an acoustic wave device in accordance with a first variation of the fourth embodiment.
Figure 27B:
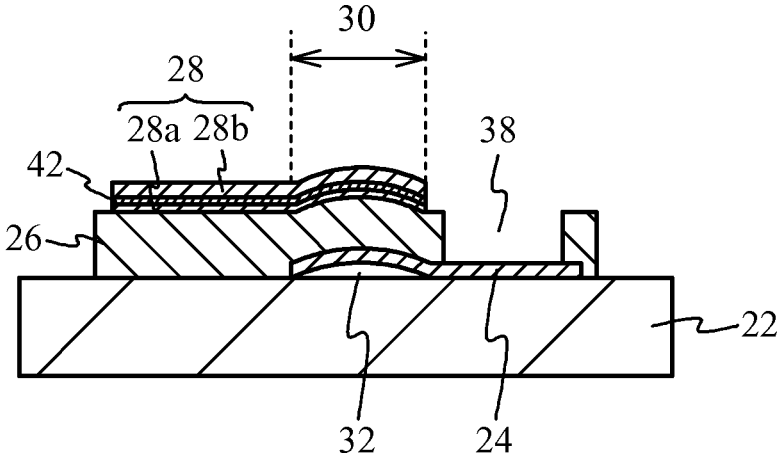
FIG. 27B is a cross-sectional view of an acoustic wave device in accordance with a second variation of the fourth embodiment.

A description will now be given of acoustic wave devices in accordance with a first variation and a second variation of the fourth embodiment. FIG. 27A is a cross-sectional view of the acoustic wave device in accordance with the first variation of the fourth embodiment, and FIG. 27B is a cross-sectional view of the acoustic wave device in accordance with the second variation of the fourth embodiment. As illustrated in FIG. 27A, an FBAR of the first variation of the fourth embodiment includes the temperature compensation film 42 located between the piezoelectric film 26 and the upper electrode 28 and contacting the piezoelectric film 26 and the upper electrode 28. An aluminum nitride film containing a trivalent element is used for the piezoelectric film 26. Other configurations are the same as those of the first variation of the first embodiment, and thus a description thereof is omitted.

As illustrated in FIG. 27B, an FBAR of the second variation of the fourth embodiment includes the upper electrode 28 including a lower layer 28a and an upper layer 28b. The temperature compensation film 42 is located between the lower layer 28a and the upper layer 28b. As described above, the upper electrodes 28 are formed on the top surface and the bottom surface of the temperature compensation film 42, and mutually electrically short-circuited. Accordingly, a capacitance of the temperature compensation film 42 fails to electrically contribute, and the effective electromechanical coupling coefficient can be made high. An aluminum nitride film containing a trivalent element is used for the piezoelectric film 26 as is the case with the first variation of the fourth embodiment. Other configurations are the same as those of the first variation of the first embodiment, and thus a description thereof is omitted.

A description will be given of a simulation conducted to investigate a relationship between a resonance frequency and a size of a resonance portion in the FBARs of the first variation and the second variation of the fourth embodiment. Simulated is an FBAR using Ru for the lower electrode 24 and the upper electrode 28, an aluminum nitride film containing Sc with a substitutional concentration of 30 atomic % for the piezoelectric film 26, and a $SiO_2$ film for the temperature compensation film 42.

In the first variation of the fourth embodiment, the resonance frequency is 2 GHz when the lower electrode 24 has a thickness of 160 nm, the piezoelectric film 26 has a thickness of 870 nm, the temperature compensation film 42 has a thickness of 100 nm, and the upper electrode 28 has a thickness of 160 nm. In addition, the area of the resonance portion 30 is $1.595\times10^{-8}$ $m^2$ when the FBAR has an impedance of 50Ω.

In the second variation of the fourth embodiment, the resonance frequency is approximately 40 MHz lower than that in the first variation of the fourth embodiment when the lower electrode 24 has a thickness of 160 nm, the piezoelectric film 26 has a thickness of 870 nm, the temperature compensation film 42 has a thickness of 100 nm, the lower layer 28a of the upper electrode 28 has a thickness of 20 nm, the upper layer 28b has a thickness of 160 nm.

As with the simulation described in FIG. 24A and FIG. 24B, the resonance frequency is varied to investigate a relationship between the resonance frequency and the film thickness of the resonance portion 30 by changing a total film thickness with keeping a ratio of film thicknesses of layers constituting the resonance portion 30 the same. In addition, the area of the resonance portion 30 is varied so that the FBAR has an impedance of 50Ω at each resonance frequency in order to investigate a relationship between the resonance frequency and the area of the resonance portion 30.

Figure 28A:
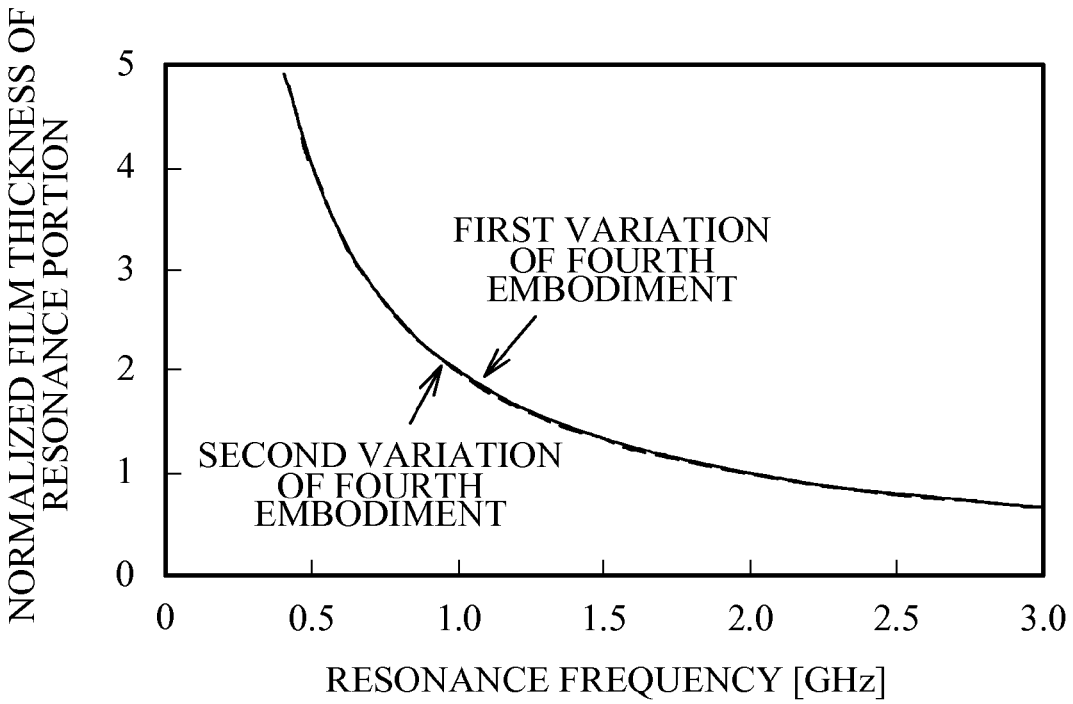
FIG. 28A illustrates relationships between a resonance frequency and a normalized film thickness of a resonance portion in the first variation and the second variation of the fourth embodiment.
Figure 28B:
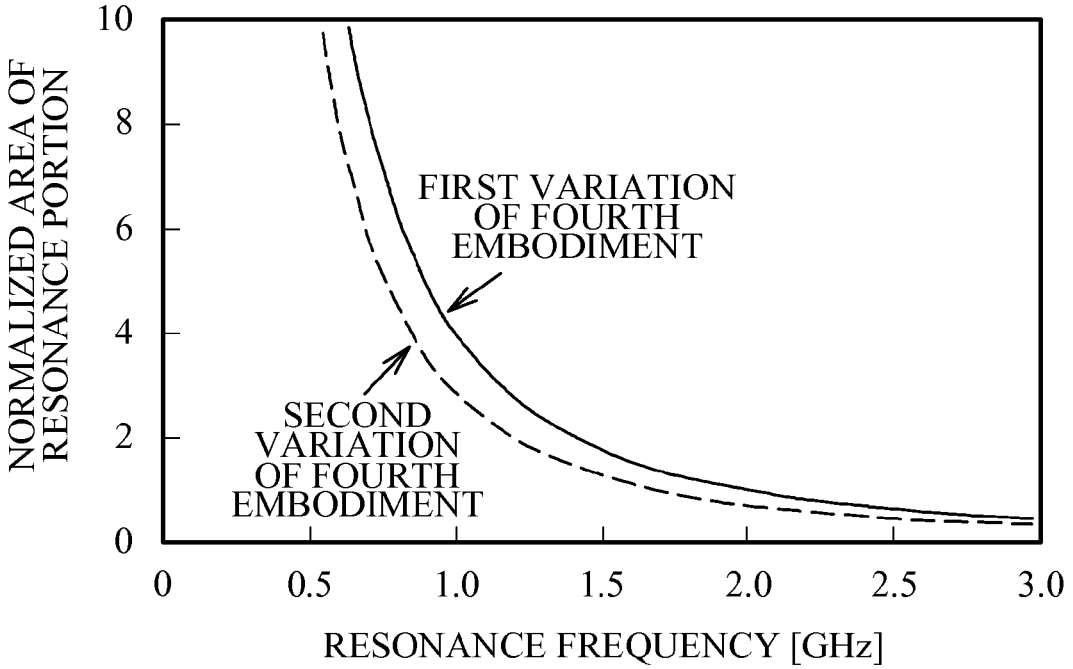
FIG. 28B illustrates a relationship between a resonance frequency and a normalized area of the resonance portion.

FIG. 28A illustrates relationships between a resonance frequency and a normalized film thickness of a resonance portion in the first variation and the second variation of the fourth embodiment, and FIG. 28B illustrates relationships between a resonance frequency and a normalized area of the resonance portion. In FIG. 28A and FIG. 28B, the normalized film thickness and the normalized area (vertical axis) are a film thickness and an area normalized by a film thickness and an area when a resonance frequency is 2 GHz in the FBAR of the first variation of the fourth embodiment, respectively. Solid lines indicate simulation results of the first variation of the fourth embodiment, and dashed lines indicate simulation results of the second variation of the fourth embodiment. FIG. 28A and FIG. 28B demonstrate that the film thickness of the resonance portion 30 is almost the same in the first variation and the second variation of the fourth embodiment at the same resonance frequency, but the area of the resonance portion 30 is small in the second variation of the fourth embodiment compared to that in the first variation. For example, when the resonance frequency is 700 MHz, the normalized area of the resonance portion is 8.20 in the first variation of the fourth embodiment, whereas that of the second variation of the fourth embodiment is 5.90 and reduced by approximately 28%.

The first variation of the fourth embodiment demonstrates that an effect of temperature compensation can be obtained and the acoustic wave device can be prevented from growing in size by using an aluminum nitride film containing an element that achieves at least one of an increase in the permittivity $\in_{33}$ and a decrease in the acoustic velocity V for the piezoelectric film 26, and including the temperature compensation film 42. The second variation of the fourth embodiment demonstrates that both a temperature compensation and an increase in the effective electromechanical coupling coefficient can be achieved and the acoustic wave device can be prevented from growing in size by including conductive films that are formed on the top surface and the bottom surface of the temperature compensation film 42 and mutually short-circuited.

In the first variation of the fourth embodiment, the temperature compensation film 42 may be inserted into the piezoelectric film 26, or may be located between the lower electrode 24 and the piezoelectric film 26. In addition, the second variation of the fourth embodiment uses the upper electrodes 28 as conductive films that are formed on the top surface and the bottom surface of the temperature compensation film 42 and mutually short-circuited, but may use the lower electrode 24. When the temperature compensation film 42 is inserted into the piezoelectric film 26, new conductive films that are mutually electrically short-circuited may be formed on the top surface and the bottom surface of the temperature compensation film 42.

Figure 29A:
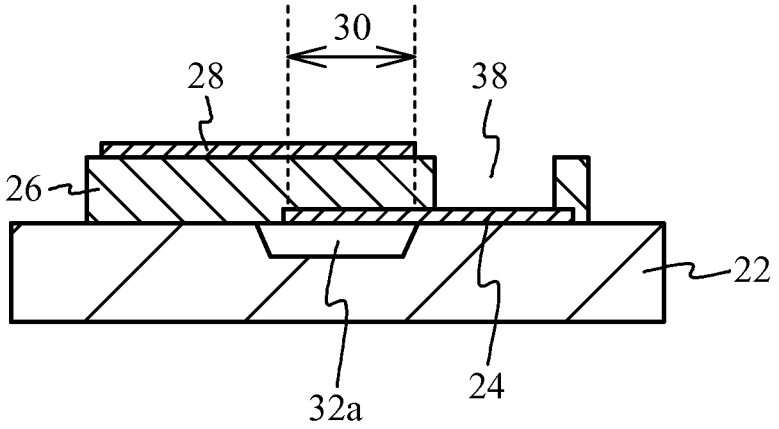
FIG. 29A is a cross-sectional view of an FBAR in accordance with a first variation of the embodiments.
Figure 29B:
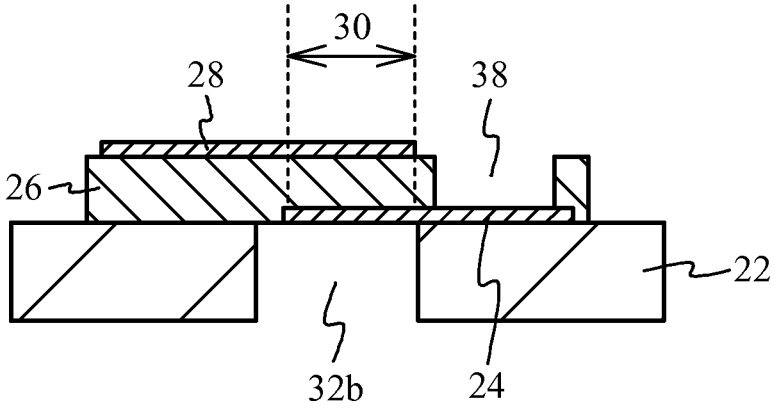
FIG. 29B is a cross-sectional view of an FBAR in accordance with a second variation of the embodiments.

As illustrated in FIG. 2B, the first embodiment through the fourth embodiment describes the air-space 32 formed by a dome-shaped bulge between the substrate 22 and the lower electrode 24, but the air-space 32 may have a structure illustrated in FIG. 29A through FIG. 29B. FIG. 29A illustrates a cross-section of an FBAR of a first variation of the embodiments, and FIG. 29B illustrates a cross-section of an FBAR of a second variation of the embodiments. As illustrated in FIG. 29A, an air-space 32a is formed by removing a part of the substrate 22 below the lower electrode 24 in the resonance portion 30 in the FBAR of the first variation of the embodiments. As illustrated in FIG. 29B, an air-space 32b is formed so that it pierces through the substrate 22 below the lower electrode 24 in the resonance portion 30 in the FBAR of the second variation of the embodiments.

Figure 29C:
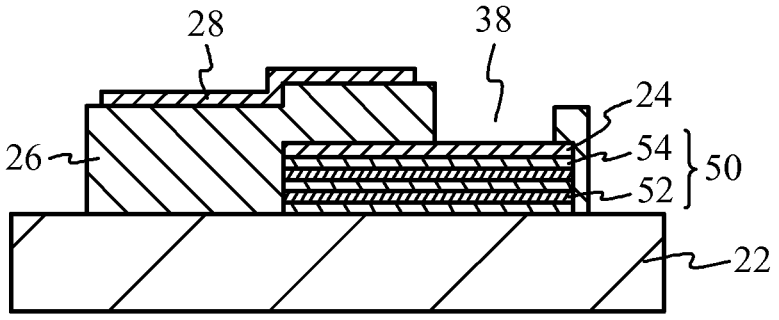
FIG. 29C is a cross-sectional view of an SMR.

In addition, the acoustic wave device is not limited to a piezoelectric thin film resonator of FBAR type, and may be a piezoelectric thin film resonator of SMR (Solidly Mounted Resonator) type. FIG. 29C illustrates a cross-section of an SMR. As illustrated in FIG. 29C, the SMR includes an acoustic reflection film 50 formed by alternately stacking a film 52 having a high acoustic impedance and a film 54 having a low acoustic impedance with a film thickness of λ/4 (λ is the wavelength of the acoustic wave) under the lower electrode 24.

Figure 30:
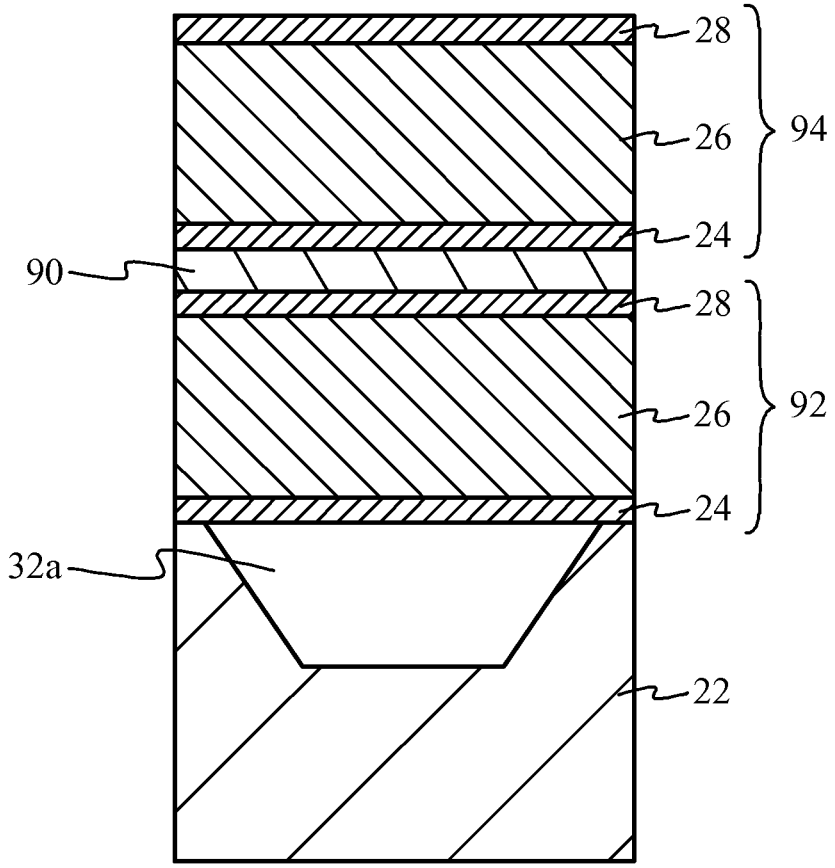
FIG. 30 is a cross-sectional view of a CRF.

Furthermore, the acoustic wave device may be a piezoelectric thin film resonator of CRF (Coupled Resonator Filter) type. FIG. 30 illustrates a cross-section of a CRF. As illustrated in FIG. 30, the CRF includes a first piezoelectric thin film resonator 92 and a second piezoelectric thin film resonator 94 stacked on the substrate 22. The first piezoelectric thin film resonator 92 includes the lower electrode 24, the piezoelectric film 26, and the upper electrode 28. The second piezoelectric thin film resonator 94 includes the lower electrode 24, the piezoelectric film 26, and the upper electrode 28. A decoupler film 90 with a single layer is located between the upper electrode 28 of the first piezoelectric thin film resonator 92 and the lower electrode 24 of the second piezoelectric thin film resonator 94. The decoupler film 90 may be a film containing silicon oxide, such as a silicon oxide film or silicon oxide film containing an additive element.

Figure 31A:
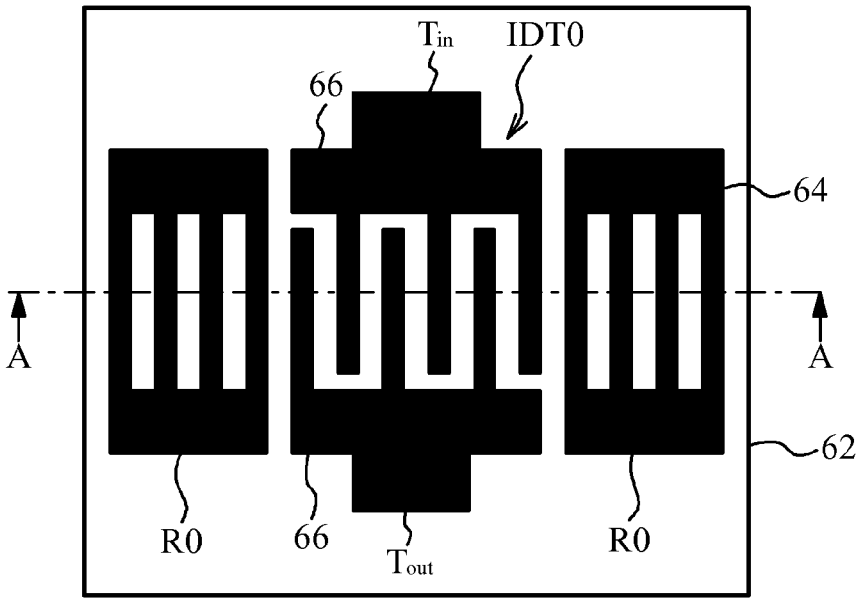
FIG. 31A is a top view of a surface acoustic wave device.
Figure 31B:
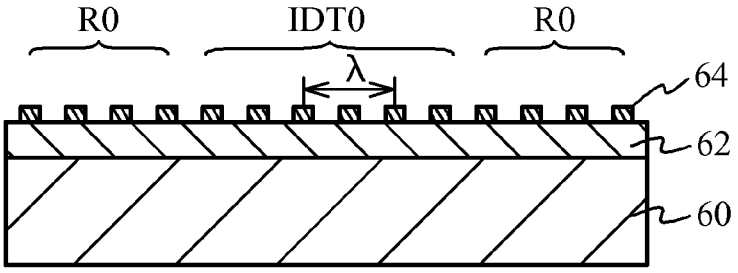
FIG. 31B is a cross-sectional view taken along line A-A in FIG. 31A.
Figure 31C:
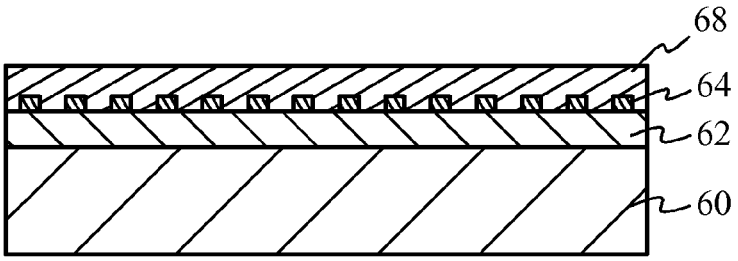
FIG. 31C is a cross-sectional view of a Love wave device.
Figure 31D:
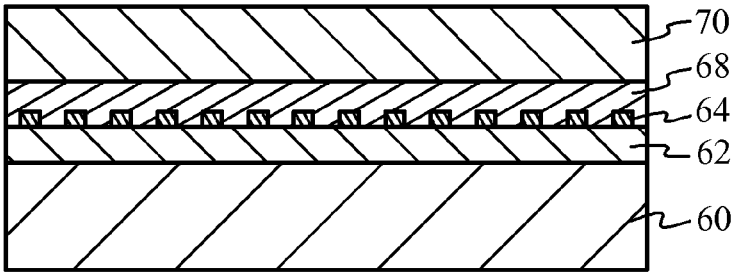
FIG. 31D is a cross-sectional view of a boundary acoustic wave device.

The acoustic wave device may be a surface acoustic wave device or Lamb wave device. FIG. 31A is a top view of a surface acoustic wave device, and FIG. 31B is a cross-sectional view taken along line A-A in FIG. 31A. FIG. 31C is a cross-sectional view of a Love wave device, and FIG. 31D is a cross-sectional view of a boundary acoustic wave device. As illustrated in FIG. 31A and FIG. 31B, a piezoelectric film 62 is formed on a support substrate 60 made of an insulative substrate such as a Si substrate, a glass substrate, a ceramic substrate, or a sapphire substrate. The piezoelectric film 62 is an aluminum nitride film containing a divalent element and a tetravalent element, an aluminum nitride film containing a divalent element and a pentavalent element, or an aluminum nitride film containing a trivalent element or other elements, and is made of the same material as that of the piezoelectric film 26 described in the first embodiment and the second embodiment, or the fourth embodiment. A metal film 64 such as Al or Cu is formed on the piezoelectric film 62. The metal film 64 forms reflectors R0, an IDT (Interdigital Transducer) IDT0, an input terminal $T_{in}$, and an output terminal $T_{out}$. The IDT0 includes two comb-shaped electrodes 66. One of the comb-shaped electrodes 66 is coupled to the input terminal $T_{in}$, and the other one is coupled to the output terminal $T_{out}$. The input terminal $T_{in}$ and the output terminal $T_{out}$ form external connection terminals. The reflectors R0 are located at both sides of the IDT0 in the propagation direction of the acoustic wave. The comb-shaped electrodes 66 and the reflectors R0 include electrode fingers arranged at intervals corresponding to the wavelength λ of the acoustic wave. The acoustic wave excited by the IDT0 propagates through the surface of the piezoelectric film 62, and is reflected by the reflectors R0. This allows the surface acoustic wave device to resonate at a frequency corresponding to the wavelength λ of the acoustic wave. That is to say, the comb-shaped electrodes 66 located on the piezoelectric film 62 function as electrodes that excite the acoustic wave propagating through the piezoelectric film 62.

Plan views of the Love wave device and the boundary acoustic wave device are the same as FIG. 31A, and thus a description thereof is omitted. The Love wave device includes a dielectric film 68 formed so as to cover the metal film 64 and contact the top surface of the piezoelectric film 62 as illustrated in FIG. 31C. The dielectric film 68 can function as a temperature compensation film when the dielectric film 68 is formed of a material having a temperature coefficient of an elastic constant opposite in sign to that of the piezoelectric film 62. The dielectric film 68 may be a film mainly containing silicon oxide such as $SiO_2$. The boundary acoustic wave device further includes a dielectric film 70 formed on the dielectric film 68 as illustrated in FIG. 31D. The dielectric film 70 may be an aluminum oxide film for example. To confine the acoustic wave in the dielectric film 68, the dielectric film 70 has an acoustic velocity faster than that in the dielectric film 68.

FIG. 31A through FIG. 31D illustrate the piezoelectric film 62 located on the support substrate 60, but the piezoelectric film 62 may be made to have a large thickness so that it has a supporting function as a substrate instead of the support substrate 60.

Figure 32:
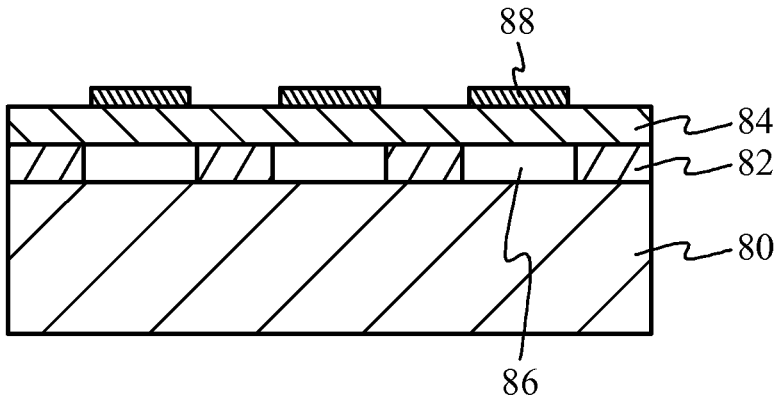
FIG. 32 is a cross-sectional view of a Lamb wave device.

FIG. 32 is a cross-sectional view of a Lamb wave device. The Lamb wave device includes a second support substrate 82 located on a first support substrate 80. The second support substrate 82 is bonded to the top surface of the first support substrate 80 by surface activated bonding or resin bonding for example. The first support substrate 80 and the second support substrate 82 may be an insulative substrate such as a Si substrate, a glass substrate, a ceramic substrate, or a sapphire substrate. A piezoelectric film 84 is located on the second support substrate 82. The piezoelectric film 84 is an aluminum nitride film containing a divalent element and a tetravalent element, an aluminum nitride film containing a divalent element and a pentavalent element, or an aluminum nitride film containing a trivalent element or other elements, and is made of the same material as that of the piezoelectric film 26 described in the first embodiment and the second embodiment, or the fourth embodiment. Hole portions piercing through the second support substrate 82 in a thickness direction are formed, and the hole portions function as air-spaces 86 between the first support substrate 80 and the piezoelectric film 84. An electrode 88 is located on the piezoelectric film 84 and in a region located above the air-spaces 86. The electrode 88 is an IDT, and reflectors (not illustrated) are located at both sides of the IDT. The acoustic wave excited by the electrode 88 is repeatedly reflected between the top and bottom surface of the piezoelectric film 84, and propagated through the piezoelectric film 84 in a lateral direction.

The Lamb wave device may also include a dielectric film formed so as to cover the electrode 88 and contact the top surface of the piezoelectric film 84 as illustrated in FIG. 31C. The dielectric film can function as a temperature compensation film when it is formed of a material having a temperature coefficient of an elastic constant opposite in sign to that of the piezoelectric film 84.

Although the embodiments of the present invention have been described in detail, it is to be understood that the various change, substitutions, and alterations could be made hereto without departing from the spirit and scope of the invention.

What is claimed is:

1. An acoustic wave device comprising:

a piezoelectric film made of an aluminum nitride film containing a divalent element and one of a tetravalent or pentavalent element; and electrodes connected to the piezoelectric film to excite an acoustic wave propagating through the piezoelectric film, wherein the divalent element and one of the tetravalent or pentavalent element are substituted for aluminum atoms of the aluminum nitride film.

2. The acoustic wave device according to claim 1, wherein the piezoelectric film is the aluminum nitride film containing the divalent element and the tetravalent element, and contains at least one of titanium, zirconium, and hafnium as the tetravalent element.

3. The acoustic wave device according to claim 2, wherein the piezoelectric film contains at least one of calcium, magnesium, strontium, and zinc as the divalent element.

4. The acoustic wave device according to claim 1, wherein the piezoelectric film is the aluminum nitride film containing the divalent element and the pentavalent element, and contains at least one of tantalum, niobium, and vanadium as the pentavalent element.

5. The acoustic wave device according to claim 4, wherein the piezoelectric film contains at least one of magnesium and zinc as the divalent element.

6. The acoustic wave device according to claim 1, wherein the piezoelectric film has a piezoelectric constant $e_{33}$ greater than 1.55 $C/m^2$.

7. The acoustic wave device according to claim 1, wherein the piezoelectric film has a ratio of a lattice constant in a c-axis direction to a lattice constant in an a-axis direction less than 1.6.

8. The acoustic wave device according to claim 1, wherein the piezoelectric film is the aluminum nitride film containing the divalent element and the tetravalent element, and a total of concentrations of the divalent element and the tetravalent element is greater than or equal to 3 atomic % and less than or equal to 35 atomic % when a total number of atoms of the divalent element, the tetravalent element, and aluminum in the aluminum nitride film defines 100 atomic %.

9. The acoustic wave device according to claim 1, wherein the piezoelectric film is the aluminum nitride film containing the divalent element and the tetravalent element, and a ratio of a concentration of the tetravalent element to a total of concentrations of the divalent element and the tetravalent element is greater than or equal to 0.35 and less than or equal to 0.75 when a total number of atoms of the divalent element, the tetravalent element, and aluminum in the aluminum nitride film defines 100 atomic %.

10. The acoustic wave device according to claim 1, wherein the piezoelectric film has a crystal structure with a c-axis orientation.

11. The acoustic wave device according to claim 1, further comprising a temperature compensation film having a temperature coefficient of an elastic constant opposite in sign to a temperature coefficient of an elastic constant of the piezoelectric film.

12. The acoustic wave device according to claim 11, wherein the temperature compensation film contacts the piezoelectric film.

13. The acoustic wave device according to claim 11, wherein the temperature compensation film contains mainly silicon oxide.

14. The acoustic wave device according to claim 1, wherein the electrode includes an upper electrode and a lower electrode facing each other across the piezoelectric film.

15. The acoustic wave device according to claim 14, further comprising:

a temperature compensation film having a temperature coefficient of an elastic constant opposite in sign to a temperature coefficient of an elastic constant of the piezoelectric film; and conductive films that are located on a top surface and a bottom surface of the temperature compensation film and electrically connected to each other.

16. The acoustic wave device according to claim 1, further comprising:

a first piezoelectric thin film resonator and a second piezoelectric thin film resonator, each including the piezoelectric film and the electrode that includes an upper electrode and a lower electrode facing each other across the piezoelectric film, wherein the first piezoelectric thin film resonator and the second piezoelectric thin film resonator are stacked, and a decoupler film is located between the upper electrode included in the first piezoelectric thin film resonator and the lower electrode included in the second piezoelectric thin film resonator.

17. The acoustic wave device according to claim 1, wherein the electrode is a comb-shaped electrode located on the piezoelectric film.

18. The acoustic wave device according to claim 17, wherein the acoustic wave excited by the electrode when the element is added to the aluminum nitride constituting the film which is then charged with electricity is a surface acoustic wave or a Lamb wave.

19. An acoustic wave device comprising:

a piezoelectric film made of an aluminum nitride film containing an element capable of at least increasing a permittivity or decreasing an acoustic velocity when the element is added to the aluminum nitride constituting the film which is then charged with electricity; and electrodes connected to the piezoelectric film to excite an acoustic wave propagating through the piezoelectric film, wherein a resonance frequency of the acoustic wave is less than or equal to 1.5 GHz, and the element is substituted for aluminum atoms of the aluminum nitride film.

20. The acoustic wave device according to claim 19, wherein the piezoelectric film has a permittivity $\in_{33}$ greater than $8.42\times10^{-11}$ F/m.

21. The acoustic wave device according to claim 19, wherein the piezoelectric film has an acoustic velocity less than 11404 m/s.

22. The acoustic wave device according to claim 19, wherein the piezoelectric film contains a divalent element and a tetravalent element as the element.

23. The acoustic wave device according to claim 22, wherein the divalent element is at least one of calcium, magnesium, strontium, and zinc, and the tetravalent element is at least one of titanium, zirconium, and hafnium.

24. The acoustic wave device according to claim 19, wherein the piezoelectric film contains a trivalent element as the element.

25. The acoustic wave device according to claim 24, wherein the trivalent element is at least one of yttrium and scandium.

26. The acoustic wave device according to claim 19, wherein the piezoelectric film has a crystal structure with a c-axis orientation.

27. The acoustic wave device according to claim 19, further comprising a temperature compensation film having a temperature coefficient of an elastic constant opposite in sign to a temperature coefficient of an elastic constant of the piezoelectric film.

28. The acoustic wave device according to claim 27, wherein the temperature compensation film contacts the piezoelectric film.

29. The acoustic wave device according to claim 27, wherein the temperature compensation film contains mainly silicon oxide.

30. The acoustic wave device according to claim 19, wherein the electrode includes an upper electrode and a lower electrode facing each other across the piezoelectric film.

31. The acoustic wave device according to claim 30, further comprising:

a temperature compensation film having a temperature coefficient of an elastic constant opposite in sign to a temperature coefficient of an elastic constant of the piezoelectric film; and conductive films that are located on a top surface and a bottom surface of the temperature compensation film and electrically connected to each other.

32. The acoustic wave device according to claim 19, further comprising:

a first piezoelectric thin film resonator and a second piezoelectric thin film resonator, each including the piezoelectric film and the electrode that includes upper electrode and a lower electrode facing each other across the piezoelectric film, wherein the first piezoelectric thin film resonator and the second piezoelectric thin film resonator are stacked, and a decoupler film is located between the upper electrode included in the first piezoelectric thin film resonator and the lower electrode included in the second piezoelectric thin film resonator.

33. The acoustic wave device according to claim 19, wherein the electrode is a comb-shaped electrode located on the piezoelectric film.

34. The acoustic wave device according to claim 33, wherein the acoustic wave excited by the electrode when the element is added to the aluminum nitride constituting the film which is then charged with electricity is a surface acoustic wave or a Lamb wave.

35. An acoustic wave device comprising:

a piezoelectric film is an aluminum nitride film containing a divalent element and a tetravalent element, and electrodes connected to the piezoelectric film to excite an acoustic wave propagating through the piezoelectric film, wherein a total of concentrations of the divalent element and the tetravalent element is greater than or equal to 3 atomic % and less than or equal to 35 atomic % when a total number of atoms of the divalent element, the tetravalent element, and aluminum in the aluminum nitride film defines 100 atomic %.

36. An acoustic wave device comprising:

a piezoelectric film is an aluminum nitride film containing a divalent element and a tetravalent element, and electrodes connected to the piezoelectric film to excite an acoustic wave propagating through the piezoelectric film, wherein a ratio of a concentration of the tetravalent element to a total of concentrations of the divalent element and the tetravalent element is greater than or equal to 0.35 and less than or equal to 0.75 when a total number of atoms of the divalent element, the tetravalent element, and aluminum in the aluminum nitride film defines 100 atomic %.

*37. An acoustic wave device comprising:*

*a piezoelectric film made of an aluminum nitride film containing a divalent element and one of a tetravalent or pentavalent element; and*

*electrodes connected to the piezoelectric film to excite, by the inverse piezoelectric effect, or cause, by a strain due to the piezoelectric effect, an acoustic wave propagating through the piezoelectric film,*

*wherein the divalent element and one of the tetravalent or pentavalent element are substituted for aluminum atoms of the aluminum nitride film.*

*38. The acoustic wave device according to claim 37, wherein*

*the piezoelectric film is the aluminum nitride film containing the divalent element and the tetravalent element, and contains at least one of titanium, zirconium, and hafnium as the tetravalent element.*

*39. The acoustic wave device according to claim 38, wherein*

*the piezoelectric film contains at least one of calcium, magnesium, strontium, and zinc as the divalent element.*

*40. The acoustic wave device according to claim 37, wherein*

*the piezoelectric film is the aluminum nitride film containing the divalent element and the pentavalent element, and contains at least one of tantalum, niobium, and vanadium as the pentavalent element.*

*41. The acoustic wave device according to claim 40, wherein*

*the piezoelectric film contains at least one of magnesium and zinc as the divalent element.*

* * * * *